United States Patent
Clampitt et al.

(10) Patent No.: US 12,490,439 B2
(45) Date of Patent: Dec. 2, 2025

(54) MEMORY CIRCUITRY AND METHODS USED IN FORMING MEMORY CIRCUITRY

(71) Applicant: Micron Technology, Inc., Boise, ID (US)

(72) Inventors: Darwin A. Clampitt, Wilder, ID (US); Patrick White, Kuna, ID (US); Kevin Y. Titus, Meridian, ID (US); Steven P. Turini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 18/435,116

(22) Filed: Feb. 7, 2024

(65) Prior Publication Data

US 2024/0268118 A1    Aug. 8, 2024

Related U.S. Application Data

(60) Provisional application No. 63/444,014, filed on Feb. 8, 2023.

(51) Int. Cl.
*H01L 21/02*        (2006.01)
*H01L 21/67*        (2006.01)
(Continued)

(52) U.S. Cl.
CPC ......... *H10B 43/27* (2023.02); *H01L 21/0217* (2013.01); *H01L 21/67063* (2013.01);
(Continued)

(58) Field of Classification Search
CPC ........ H10B 43/27; H10B 43/35; H10B 43/40; H01L 21/0217; H01L 21/67063
(Continued)

(56) References Cited

U.S. PATENT DOCUMENTS

2020/0127004 A1\*  4/2020  Dorhout .............. H10B 43/10
2020/0328222 A1\*  10/2020  Barclay ............... H10B 43/10
(Continued)

OTHER PUBLICATIONS

U.S. Appl. No. 18/602,313, filed Mar. 12, 2024, by Clampitt et al.
U.S. Appl. No. 19/045,017, filed Feb. 4, 2025, by Clampitt.

*Primary Examiner* — Ly D Pham
(74) *Attorney, Agent, or Firm* — Wells St. John P.S.

(57) ABSTRACT

A method used in forming memory circuitry comprises forming a stack where strings of memory cells will be formed and a select-gate region directly above the stack. The stack comprises vertically-alternating different-composition first tiers and second tiers having lower channel openings extending there-through. The select-gate region comprises upper channel openings extending there-through and that are individually directly above and extend to individual of the lower channel openings. Storage material of the strings of memory cells is formed simultaneously in the upper and lower channel openings. Then, insulative charge-passage material of the strings of memory cells is formed simultaneously in the upper and lower channel openings. Then, channel material is formed simultaneously in the upper and lower channel openings. The storage material is removed from the upper channel openings. After the removing, a select gate is formed in the select-gate region operatively aside the channel material in the select-gate region. Other embodiments, including structure, are disclosed.

14 Claims, 26 Drawing Sheets

(51) Int. Cl.
  *H10B 43/27*  (2023.01)
  *H10B 43/35*  (2023.01)
  *H10B 43/40*  (2023.01)
  *H10B 43/10*  (2023.01)

(52) U.S. Cl.
  CPC ............ *H10B 43/35* (2023.02); *H10B 43/40*
    (2023.02); *H10B 43/10* (2023.02)

(58) Field of Classification Search
  USPC .................................................... 365/185.17
  See application file for complete search history.

(56) References Cited

U.S. PATENT DOCUMENTS

| | | | |
|---|---|---|---|
| 2021/0202324 A1* | 7/2021 | Scarbrough | H10D 84/038 |
| 2021/0217694 A1* | 7/2021 | Jain | H01L 23/528 |
| 2023/0011135 A1* | 1/2023 | Hopkins | H10B 41/35 |
| 2023/0320085 A1* | 10/2023 | Surthi | H10B 43/27 |
| | | | 257/213 |
| 2023/0389312 A1* | 11/2023 | Howder | H10B 41/27 |
| 2024/0046989 A1* | 2/2024 | Chen | G11C 16/0483 |
| 2024/0074201 A1* | 2/2024 | King | H10B 41/35 |

\* cited by examiner

MEMORY CIRCUITRY AND METHODS USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
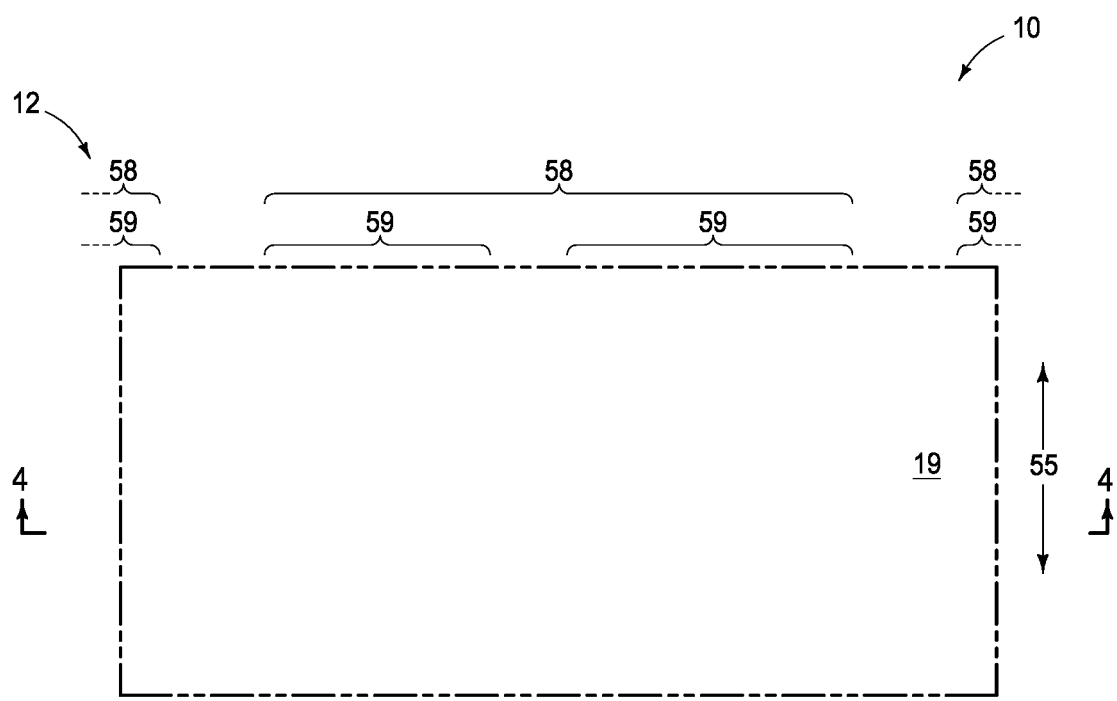
FIGS. 1-4 are diagrammatic cross-sectional views of portions of a construction that will comprise memory circuitry in accordance with an embodiment of the invention.
Figure 2:
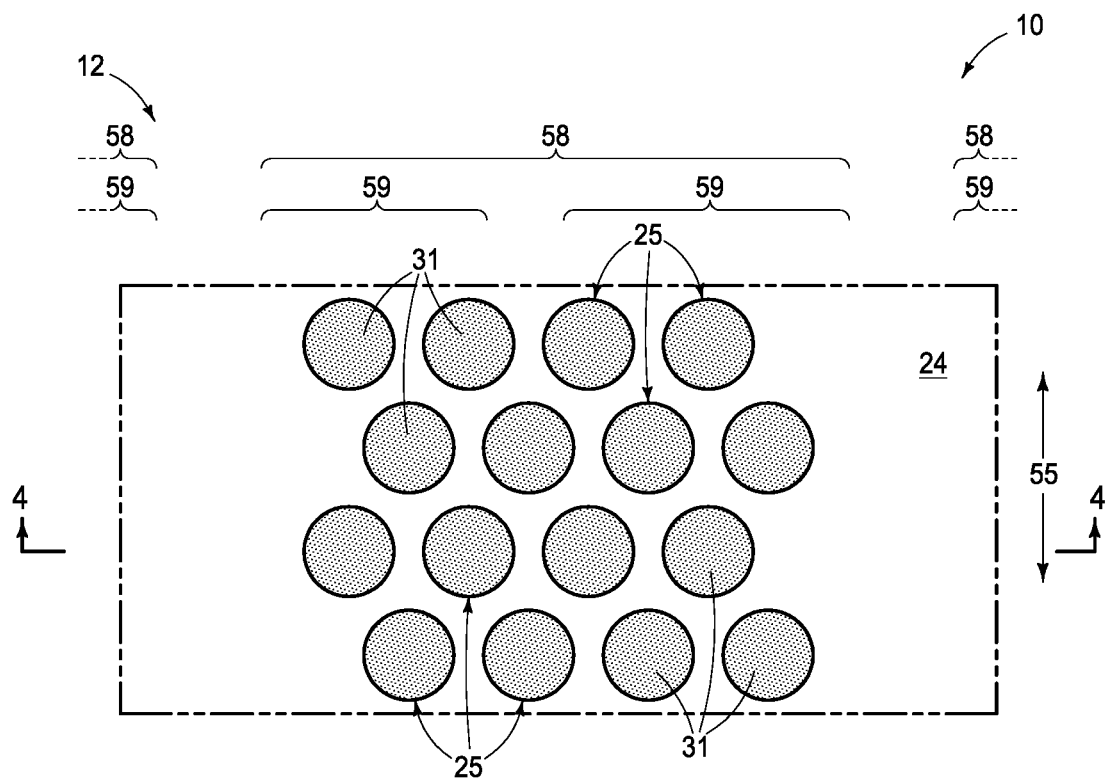
Figure 3:
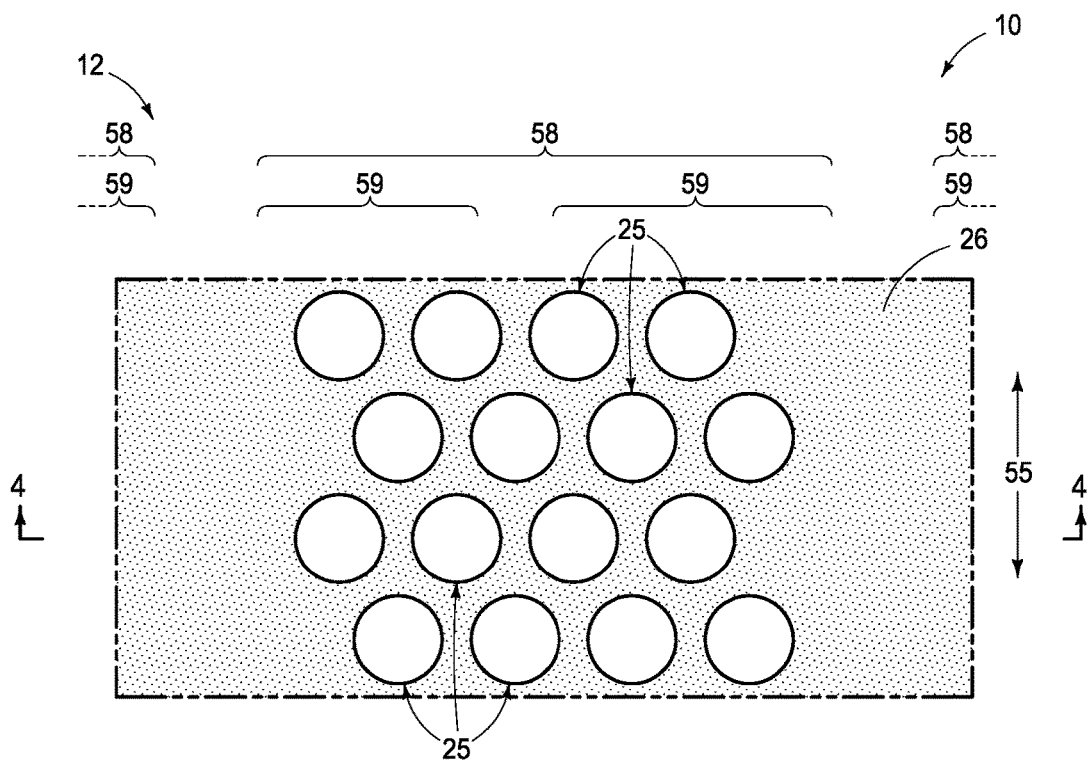
Figure 4:
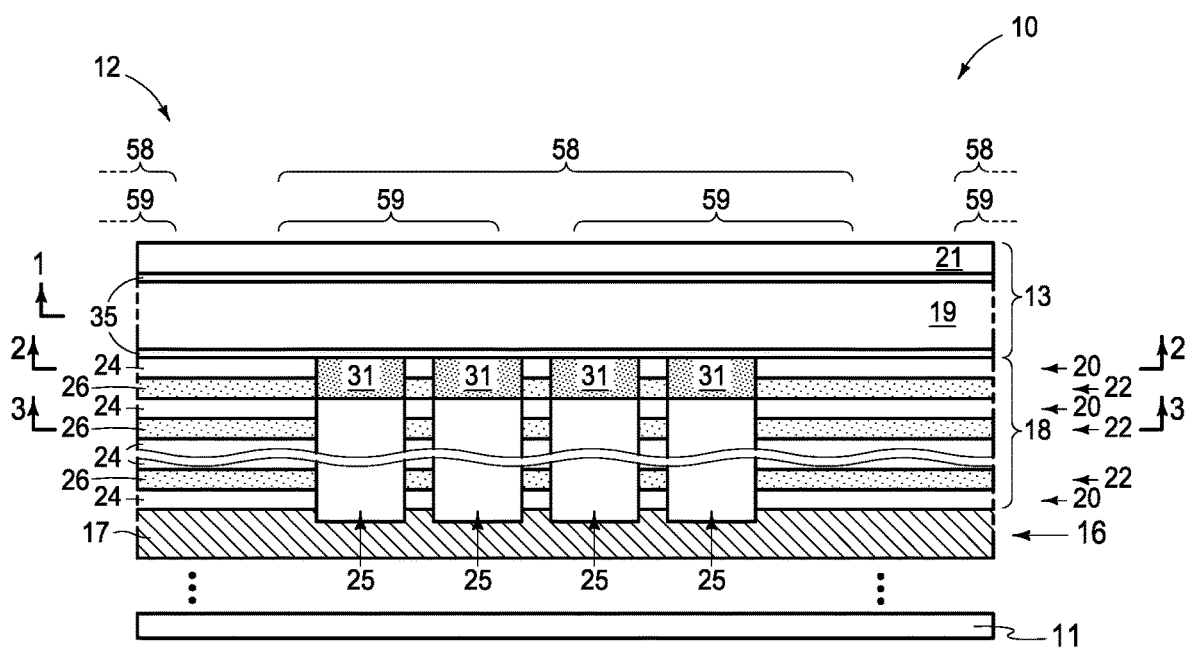

Embodiments of the invention encompass methods used in forming memory circuitry, for example that comprising an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass memory circuitry comprising strings of memory cells (e.g., NAND architecture) independent of method of manufacture. Example method embodiments are described with reference to FIGS. 1-39.

FIGS. 1-4 show an example construction 10 having an array 12 in which strings of transistors and/or memory cells will be formed. Example construction 10 includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., WSi$_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A stack 18 where strings of memory cells will be formed has been formed above conductor tier 16 (e.g., comprising vertically-alternating different-composition first/conductive tiers 22 and second/insulative tiers 20). Example thickness for each of tiers 20 and 22 is 20 to 60 nanometers. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select-gate tiers (not shown) may be between conductor tier 16 and the lowest conductive tier 22. Conductive tiers 22 may not be conductive at this point of processing, for example if "gate-last"/"replacement gate", and insulative tiers 20 may not be insulative at this point of processing. Regardless, in some embodiments conductive tiers 22 are referred to as first tiers 22 and insulative tiers 20 are referred to as second tiers 20, and which are of different compositions relative one another. Example insulative/second tiers 20 comprise insulative material 24 (e.g., silicon dioxide and/or other material that may be of one or more composition(s)). Example conductive/first tiers 22 comprise sacrificial material 26 (e.g., silicon nitride) in the example gate-last processing. Such would comprise conductive material (not shown) in so-called gate-first processing.

Lower channel openings 25 have been formed (e.g., by etching) through insulative tiers 20 and conductive tiers 22 to conductor tier 16. Lower channel openings 25 may taper radially-inward and/or radially-outward (not shown) moving deeper into stack 18. Channel openings 25 may go into conductor material 17 of conductor tier 16 as shown or may stop there-atop (not shown). Alternately, as an example, channel openings 25 may stop atop or within the lowest insulative tier 20. A reason for extending lower channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example, for brevity, and for clarity only, channel openings 25 are shown as being arranged in groups or columns of staggered rows of four openings 25 per row and being arrayed in laterally-spaced memory-block regions 58 that will comprise laterally-spaced memory blocks 58 in a finished-circuitry construction. Memory-block regions 58 and resultant memory blocks 58 may be considered as being longitudinally elongated and oriented, for example along a first direction 55. Any alternate existing or future-developed arrangement and construction may be used.

Sacrificial material 31 (e.g., Al$_2$O$_3$) is in upper portions of lower channel openings 25. Such may be of any suitable vertical thickness such that an etch thereto (described subsequently) doesn't go completely there-through.

A select-gate region 13 has been formed directly above stack 18. Select-gate region 13 comprises sub-blocks 59. Only two sub-blocks 59 are shown in each memory block 58 although more sub-blocks may be in each and not all memory blocks need have the same number of sub-blocks. In one embodiment, select-gate region 13 comprises a sacrifice material 19 (e.g., polysilicon) and insulating material 21 (e.g., silicon dioxide) directly there-above. Sacrifice material 19 and sacrificial material 31 are of different compositions relative one another. In one such embodiment, sacrifice material 19 is vertically sandwiched between two layers 35 of carbon-doped silicon nitride (e.g., that may provide etch selectivity in subsequent etches better than would insulating material 21 and insulative material 24; e.g., carbon content in the carbon-doped silicon nitride at $1\times10^{15}$ atoms/cm$^3$ to 25 atomic percent).

Figure 5:
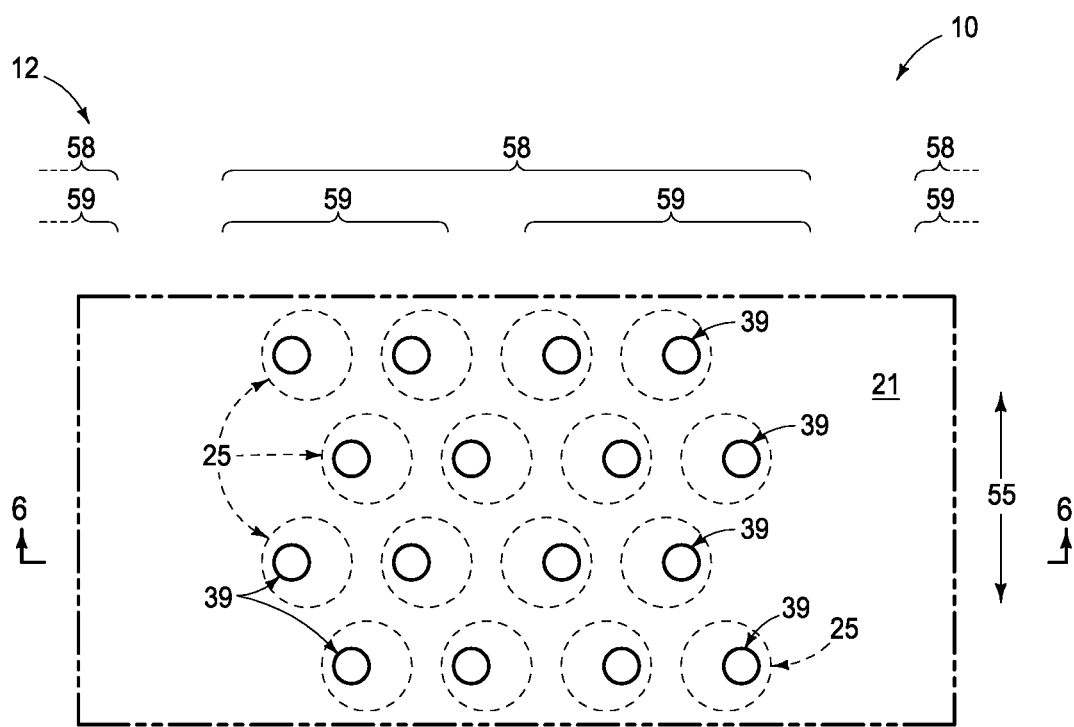
FIGS. 5-39 are diagrammatic sequential sectional and/or enlarged views of the construction of FIGS. 1-4, or portions thereof or alternate and/or additional embodiments, in process in accordance with some embodiments of the invention.
Figure 6:
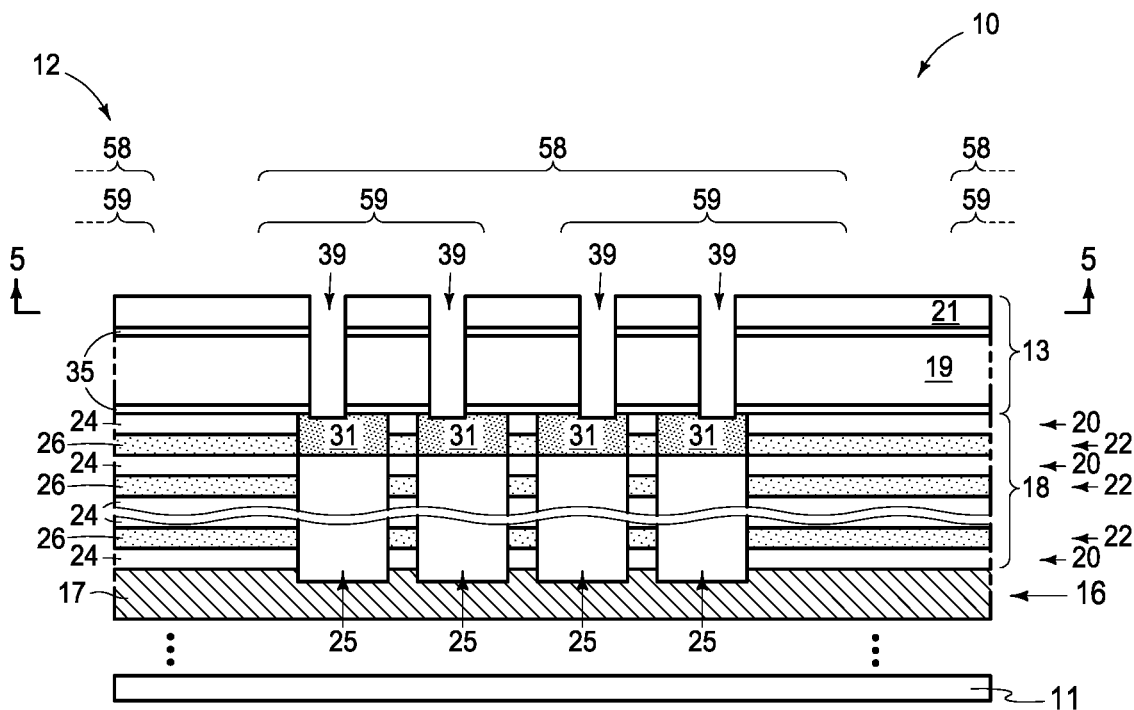

Referring to FIGS. 5 and 6, upper channel openings 39 have been formed through insulating material 21 and sacrifice material 19 (and layers 35 when present) and that are individually directly above and extend to sacrificial material 31 that is in the upper portions of individual lower channel openings 25.

Figure 7:
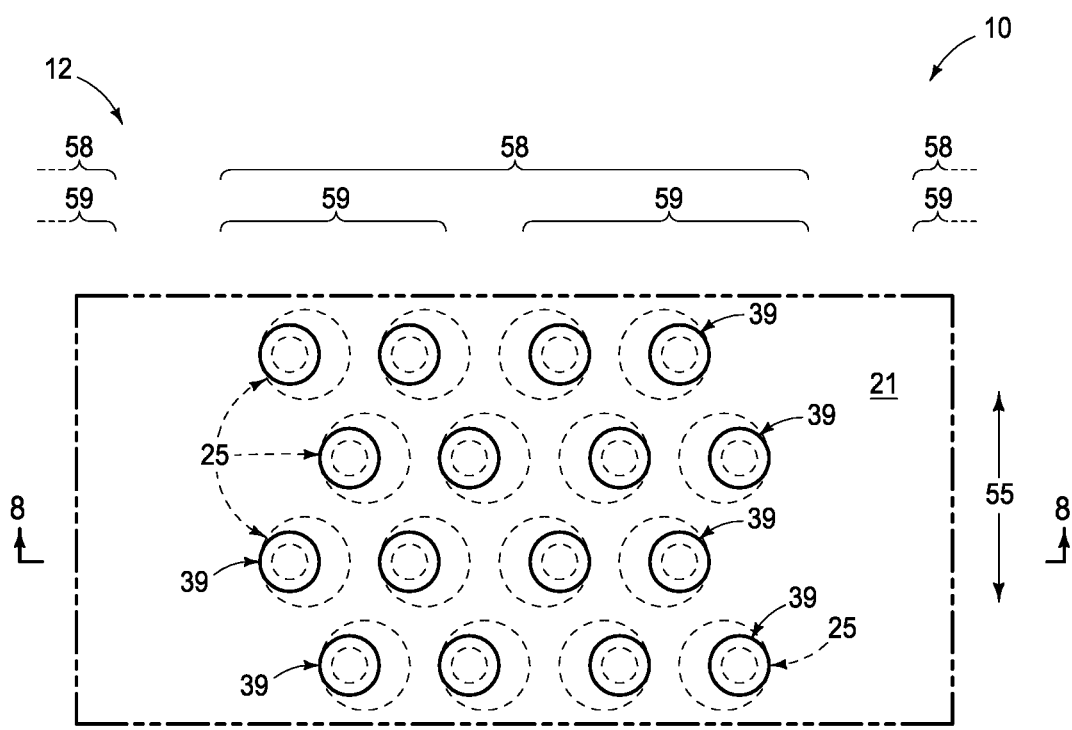
Figure 8:
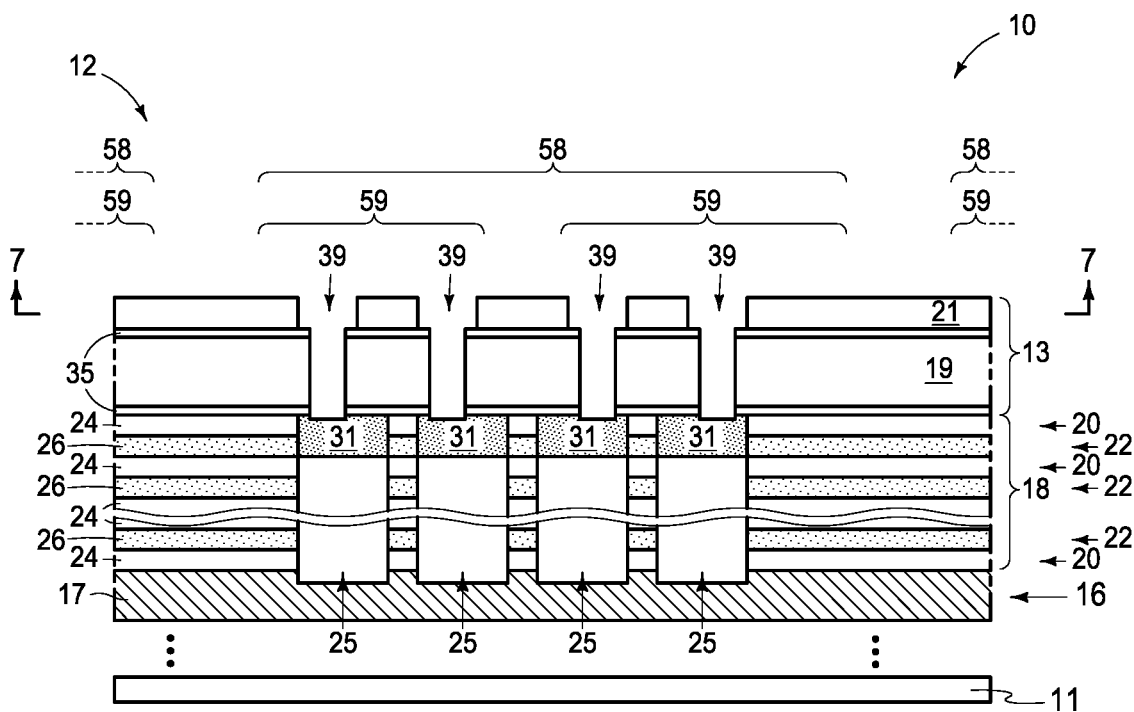

Referring to FIGS. 7 and 8, upper channel openings 39 have been widened (e.g., by isotropic etching using HF) to be horizontally larger in insulating material 21 than in sacrifice material 19. Upper channel openings 39 below insulating material 21 may be filled with another material (e.g., spin-on-carbon and not shown) if the chemistry used to etch insulating material 21 would also etch one or more of materials 31, 35, and 19.

Figure 9:
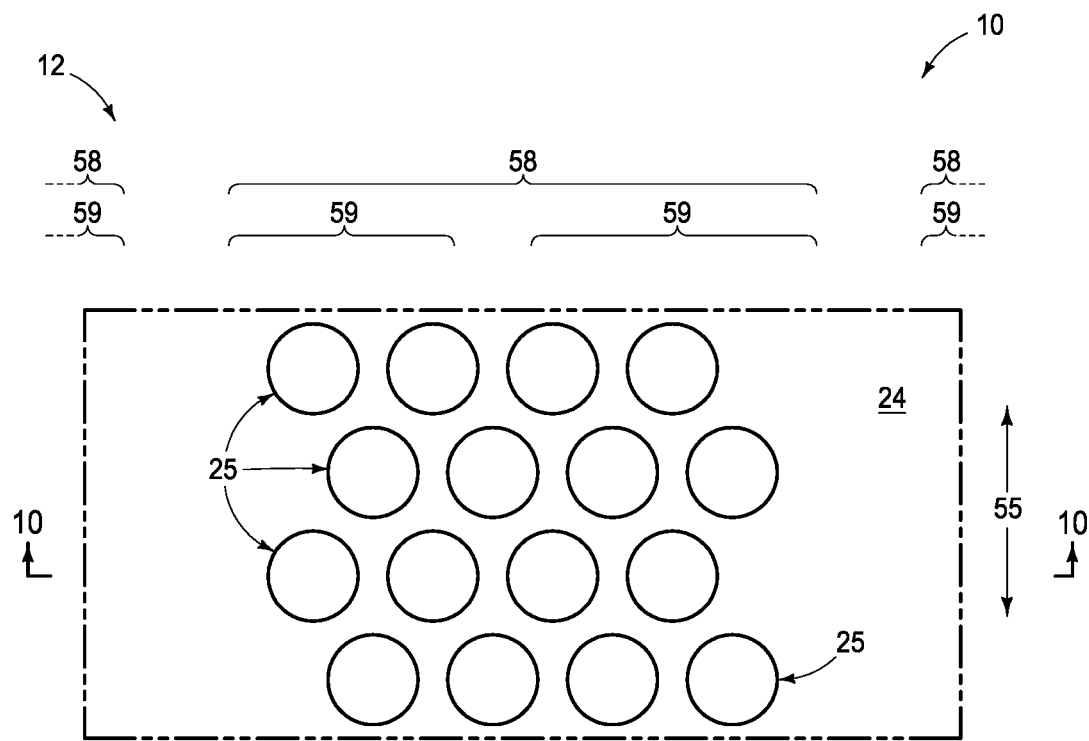
Figure 10:
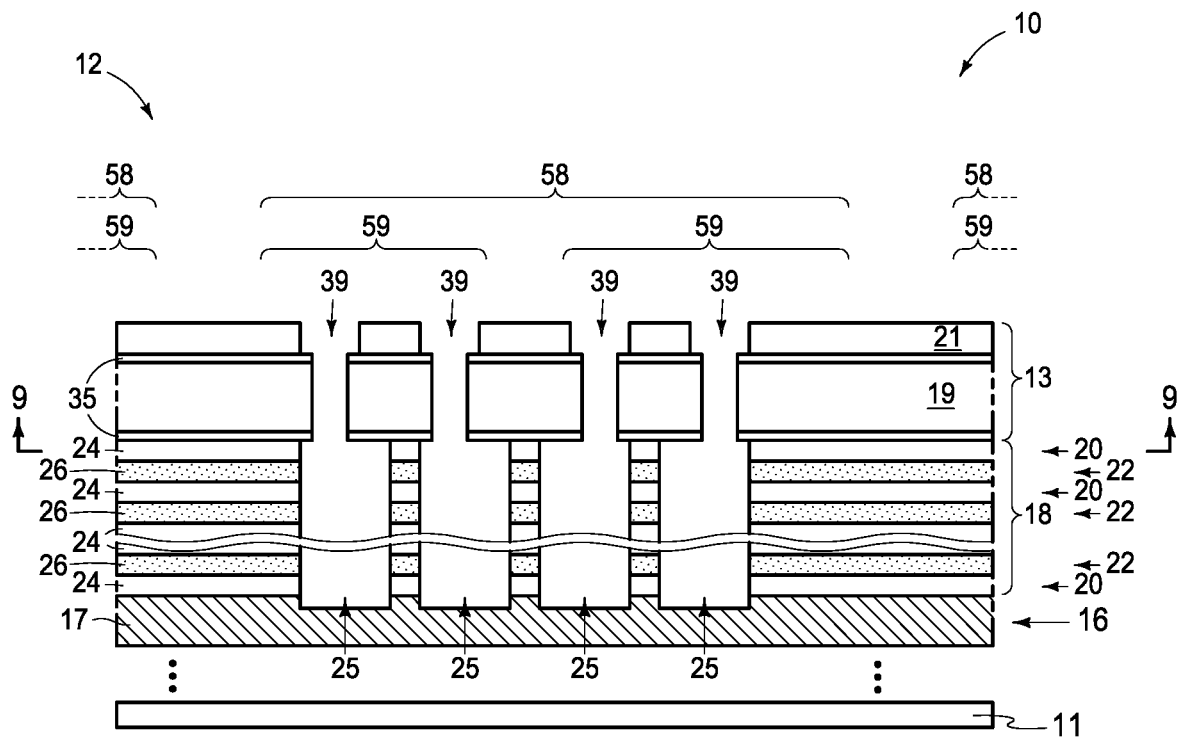
Figure 11:
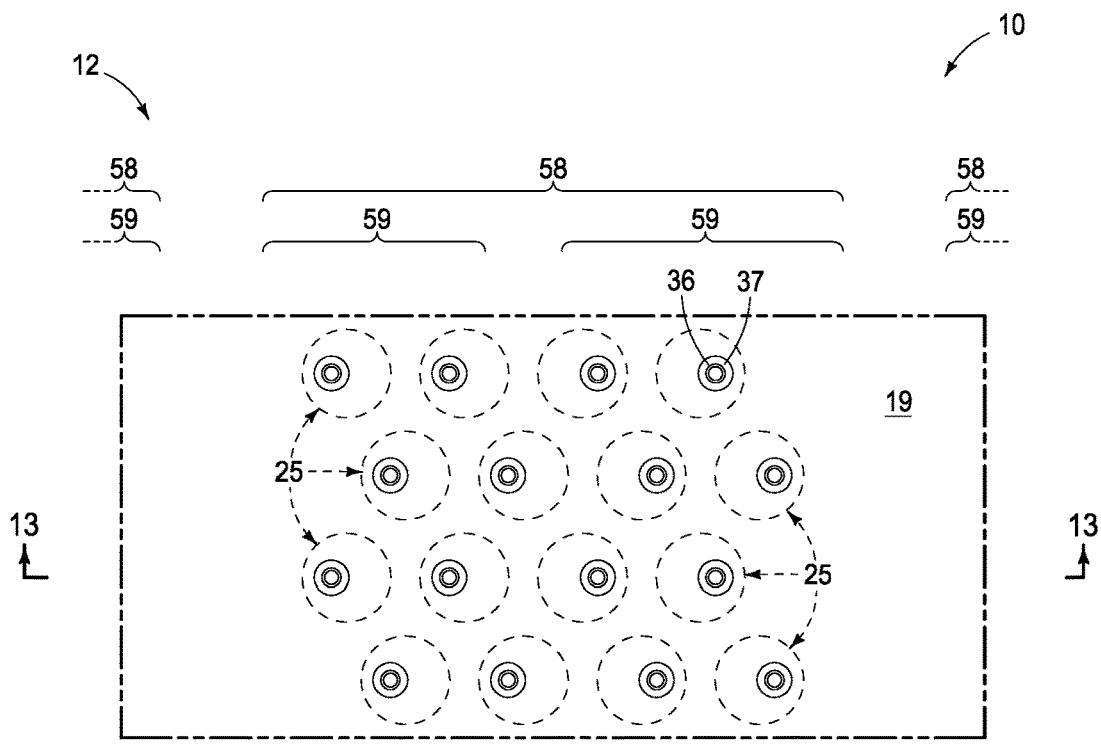
Figure 12:
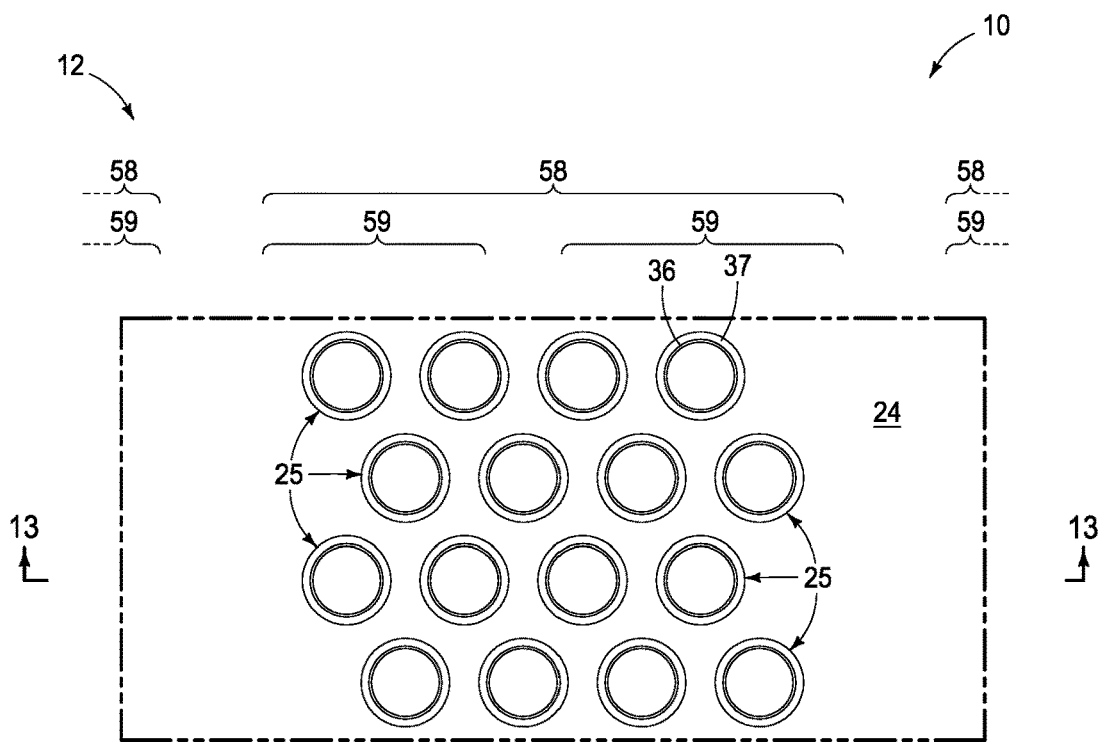
Figure 13:
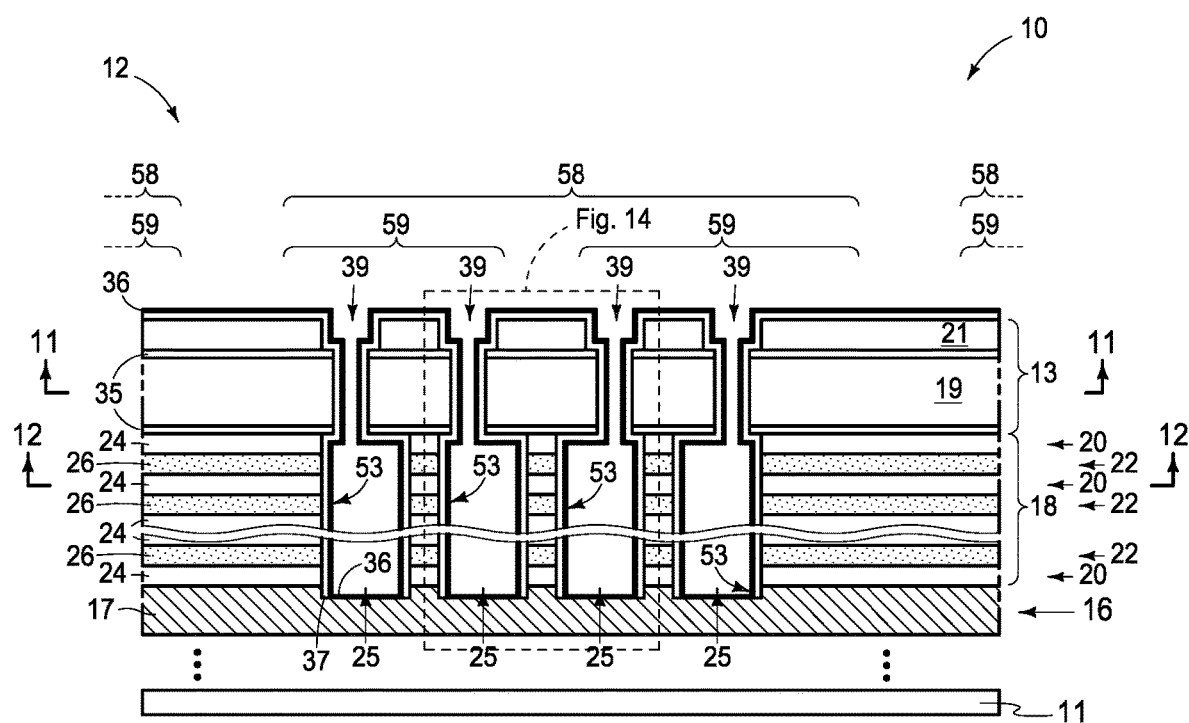
Figure 14:
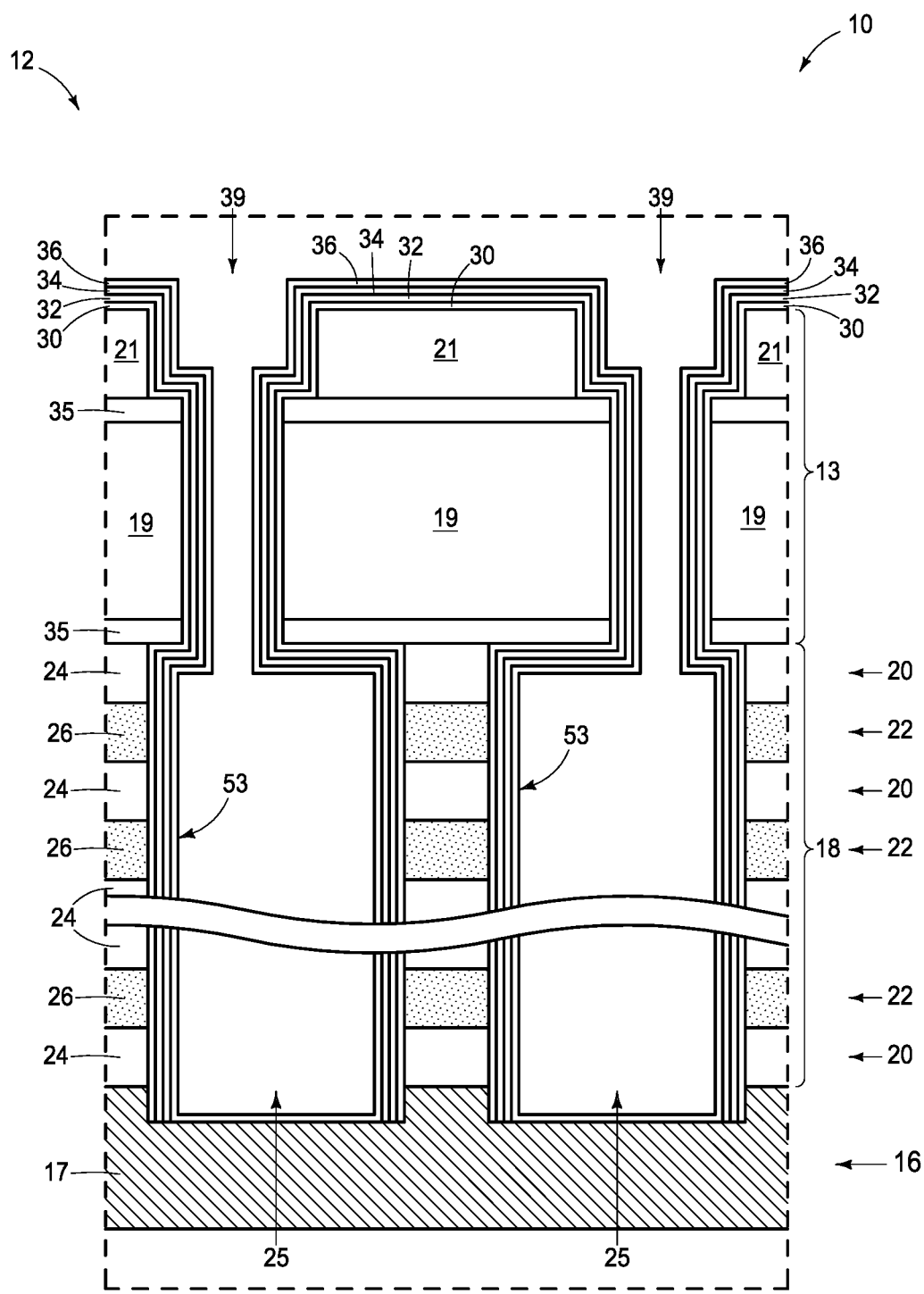
Figure 15:
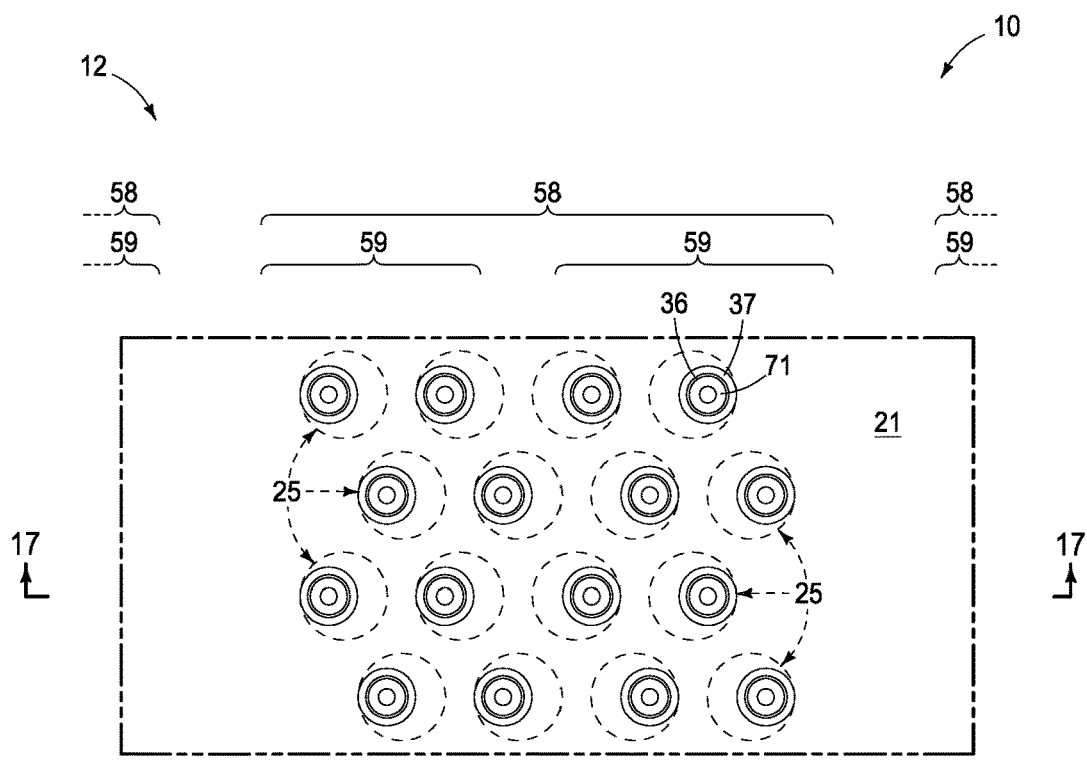
Figure 16:
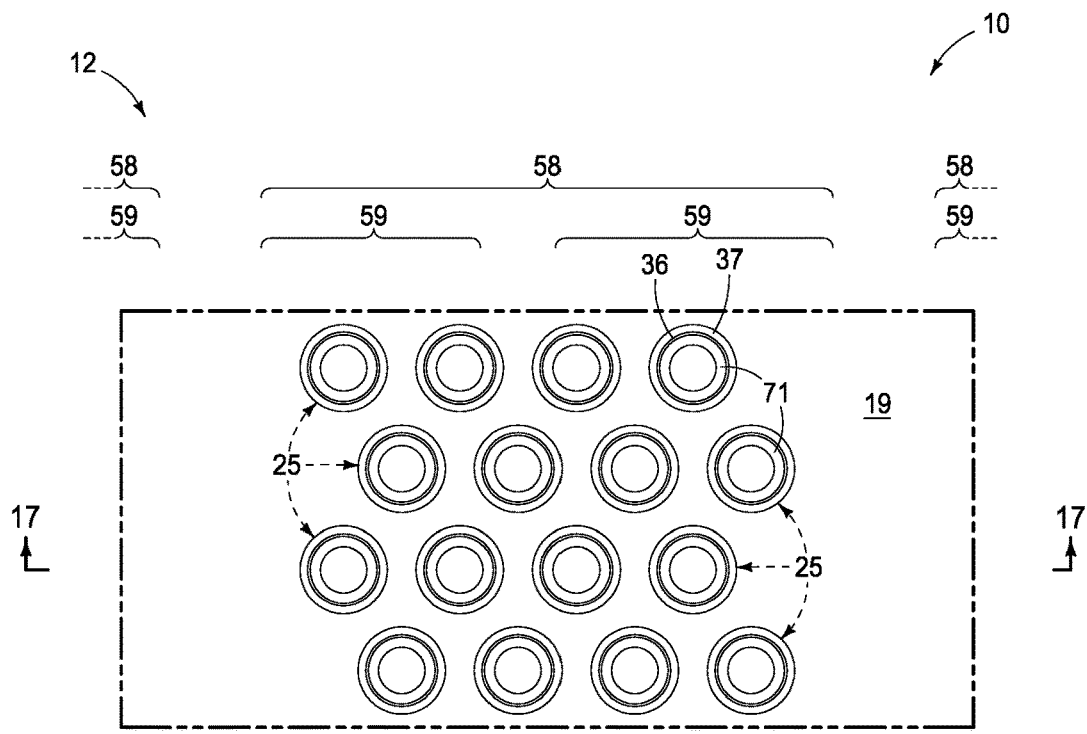
Figure 17:
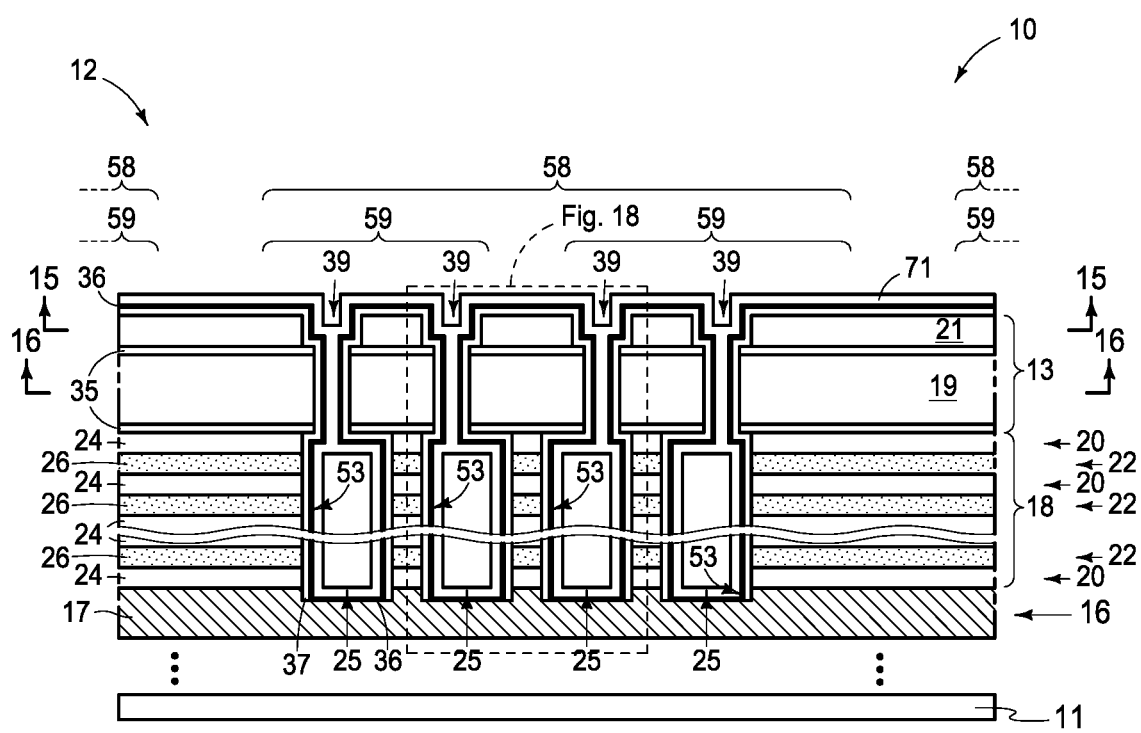
Figure 18:
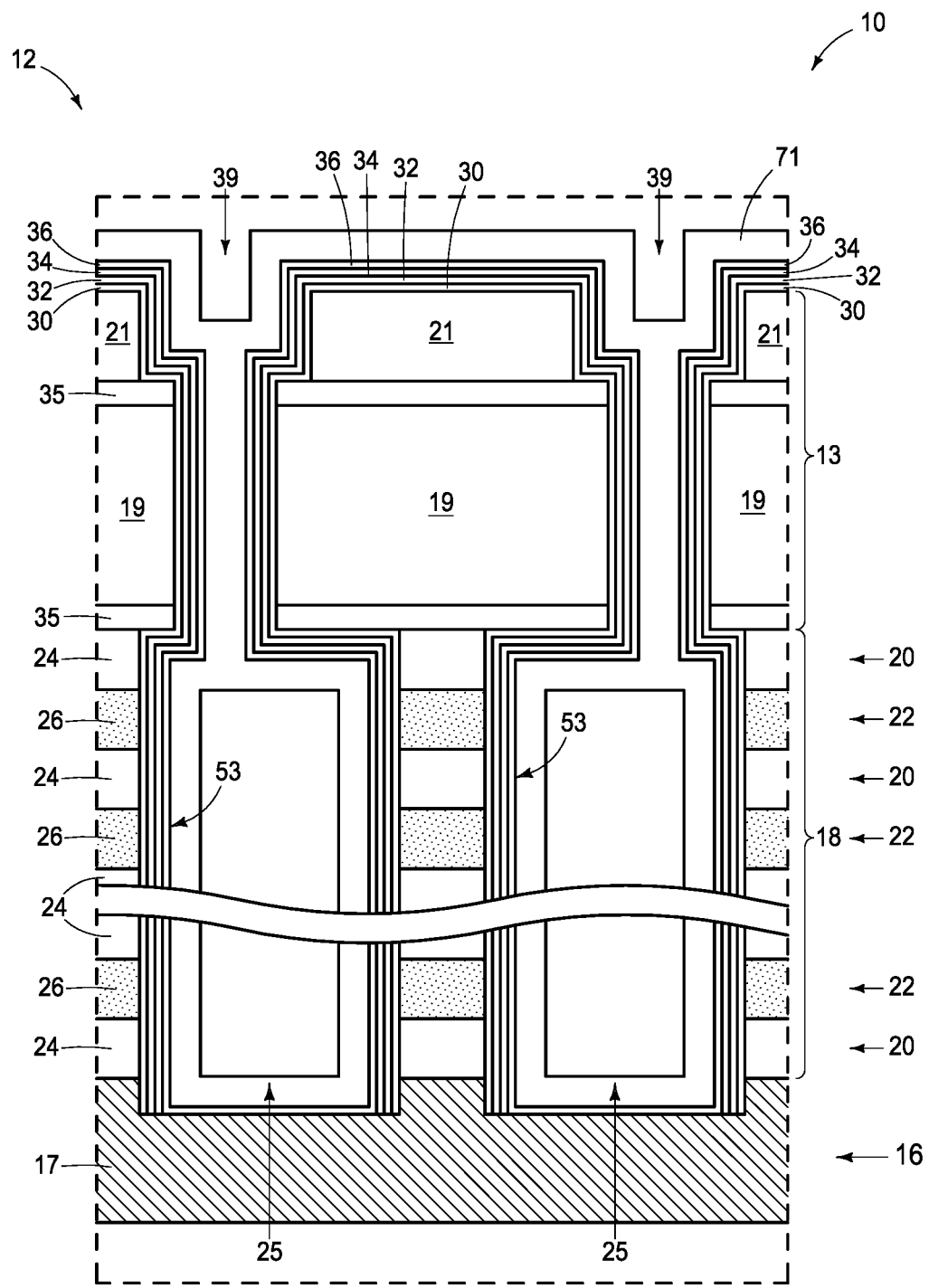

Referring to FIGS. 9 and 10, through upper channel openings 39, sacrificial material 31 (not shown) has been etched away from lower channel openings 25 selectively relative to insulating material 21, sacrifice material 19, and different-composition first tiers 22 and second tiers 20. The artisan is capable of selecting a suitable etching chemistry depending on composition of such materials.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Referring to FIGS. 11-14, storage material 32 of the strings of memory cells has been formed simultaneously in upper and lower channel openings 39, 25, followed by forming insulative charge-passage material 34 of the strings of memory cells simultaneously in upper and lower channel openings 39, 25, and followed by forming channel material 36 simultaneously in upper and lower channel openings 39, 25. In one embodiment, charge-blocking material 30 of the strings of memory cells has been formed simultaneously in upper and lower channel openings 39, 25 prior to and then forming storage material 32. Regardless, channel material 36 comprises individual operative channel-material strings 53, in one embodiment having memory-cell materials (e.g., 30, 32, and 34) there-along and with material 24 in insulative tiers 20 being horizontally-between immediately-adjacent channel-material strings 53. Materials 30, 32, and 34 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of lower channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown).

Referring to FIGS. 15-18, insulator material 71 (e.g., silicon dioxide) has been formed in upper channel openings 39 to fill those portions thereof that are within sacrifice material 19 and less-than-fill those portions thereof that are within insulating material 21.

Figure 19:
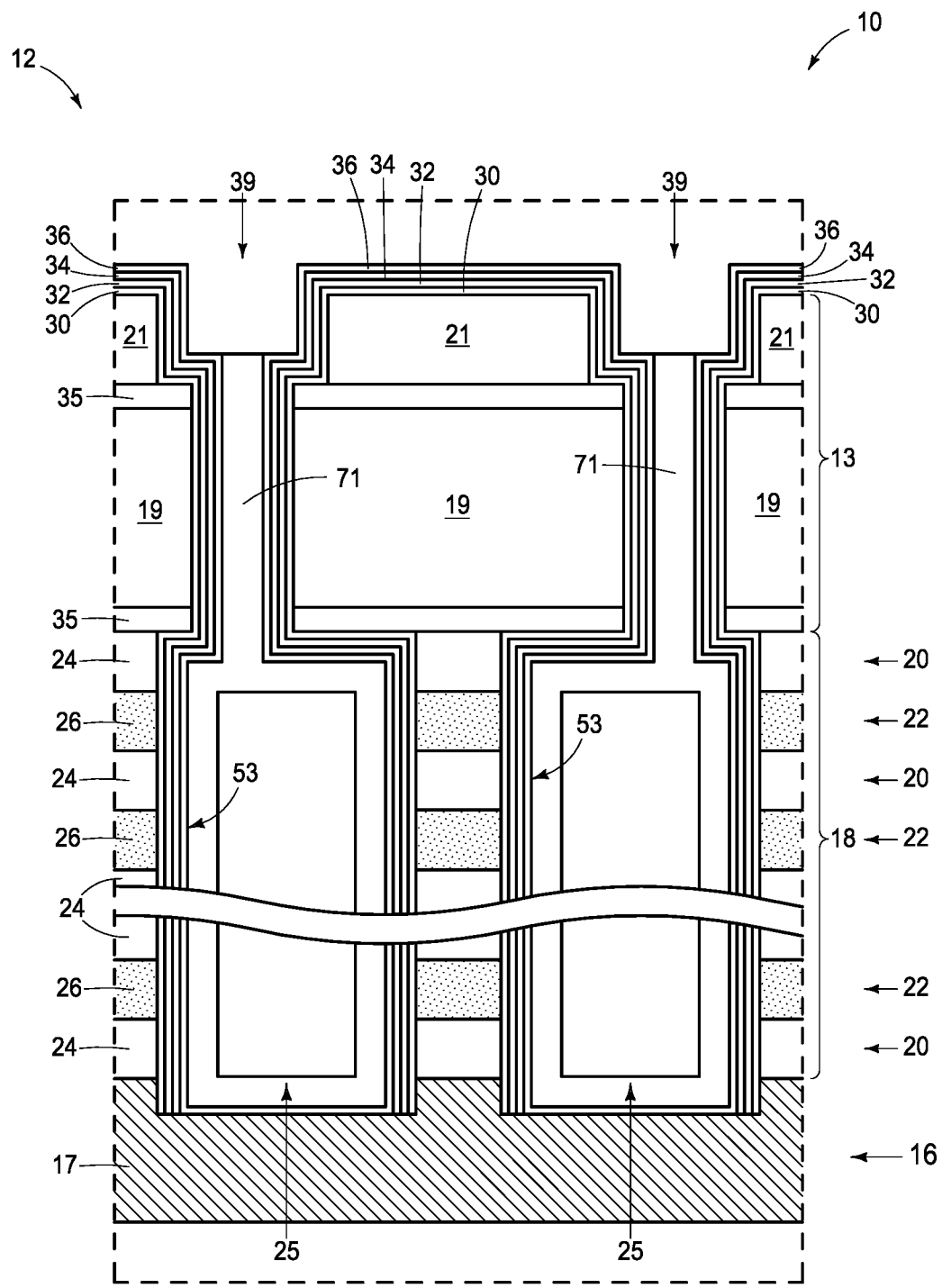

Referring to FIG. 19, at least some of insulator material 71 that is in individual upper channel openings 39 has been etched in those portions thereof that are within insulating material 21 to expose channel material 36 that is in select-gate region 13.

Figure 20:
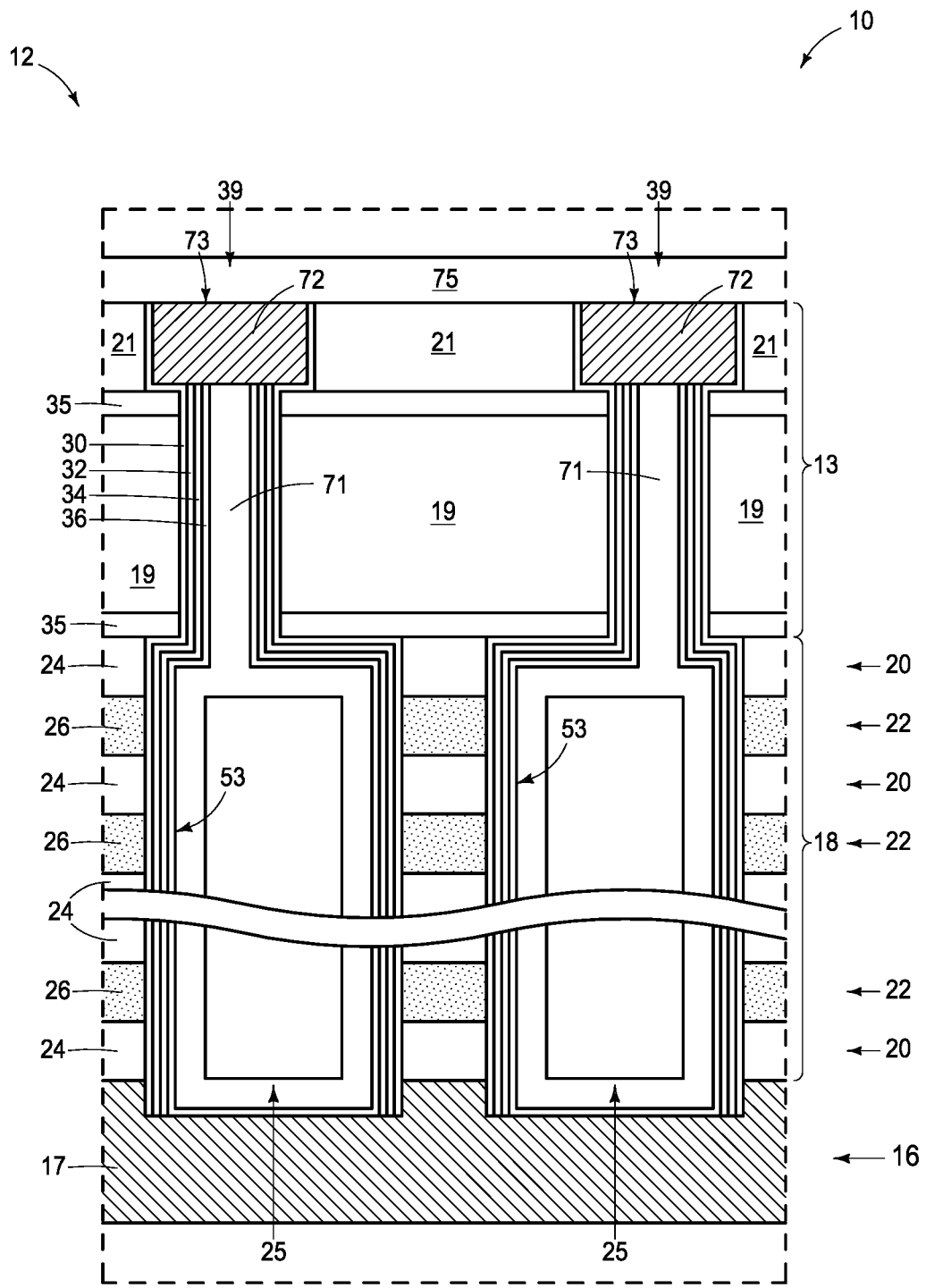
Figure 21:
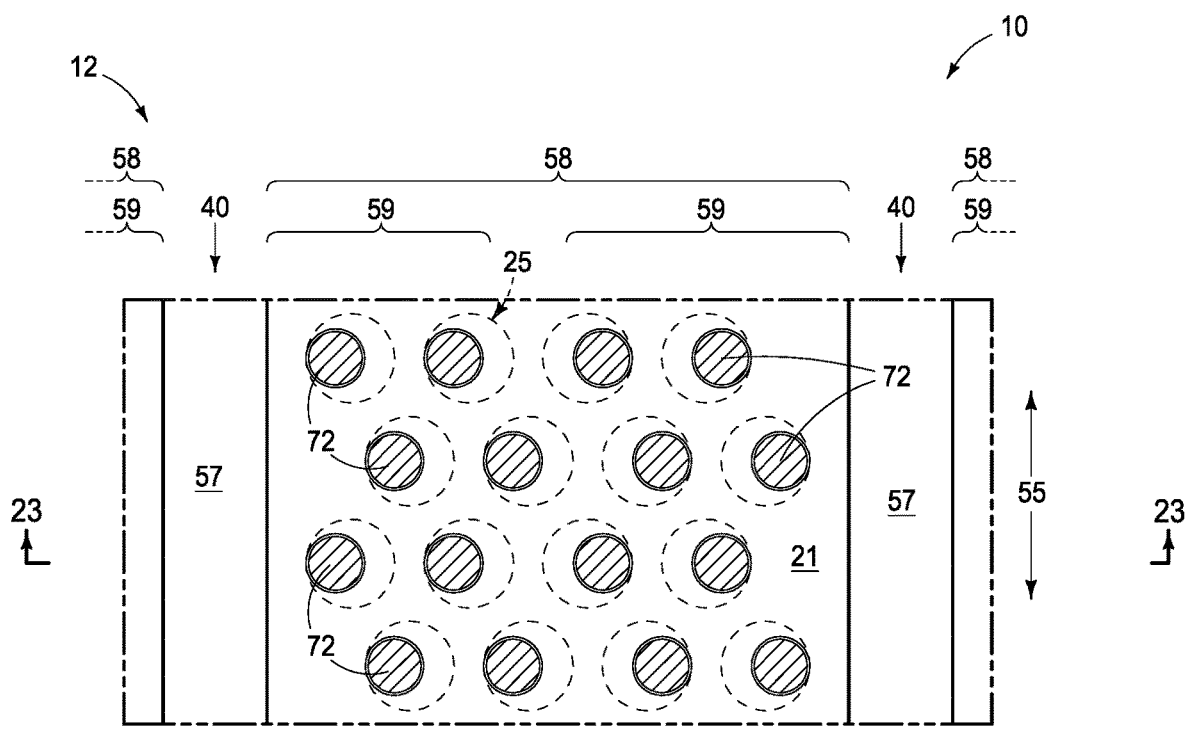
Figure 22:
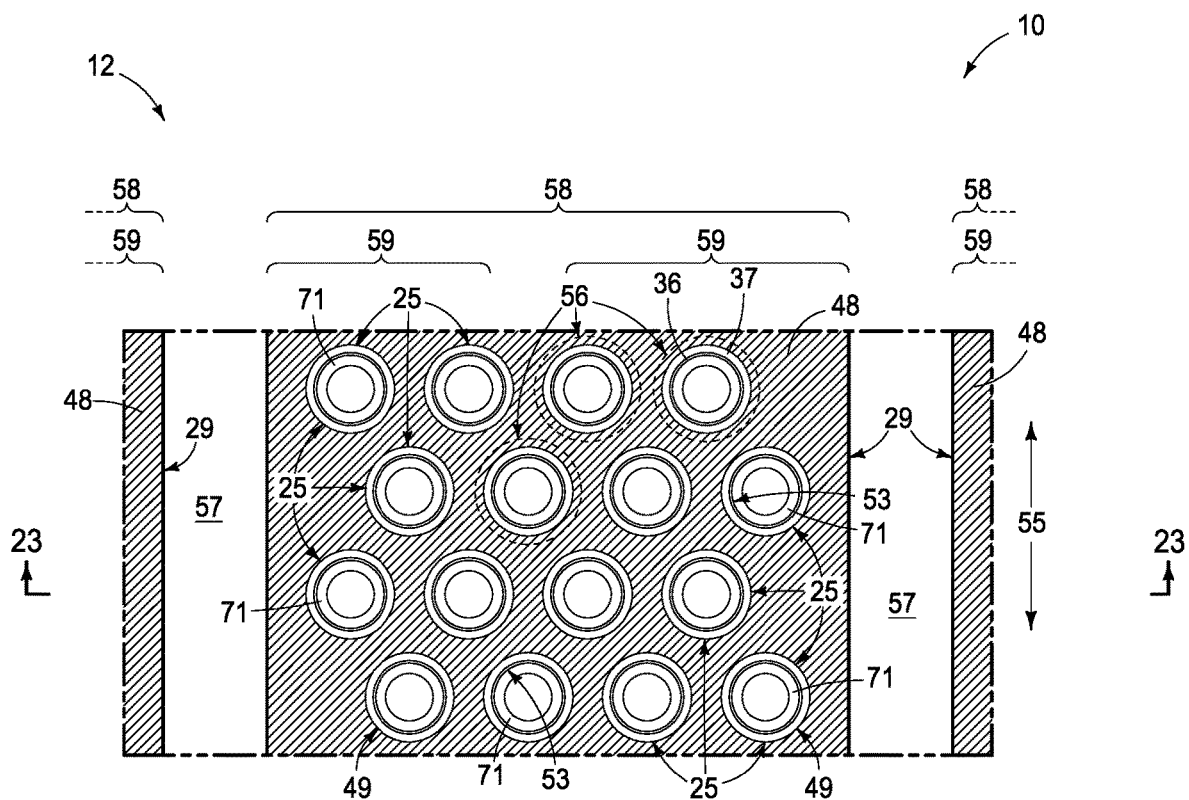
Figure 23:
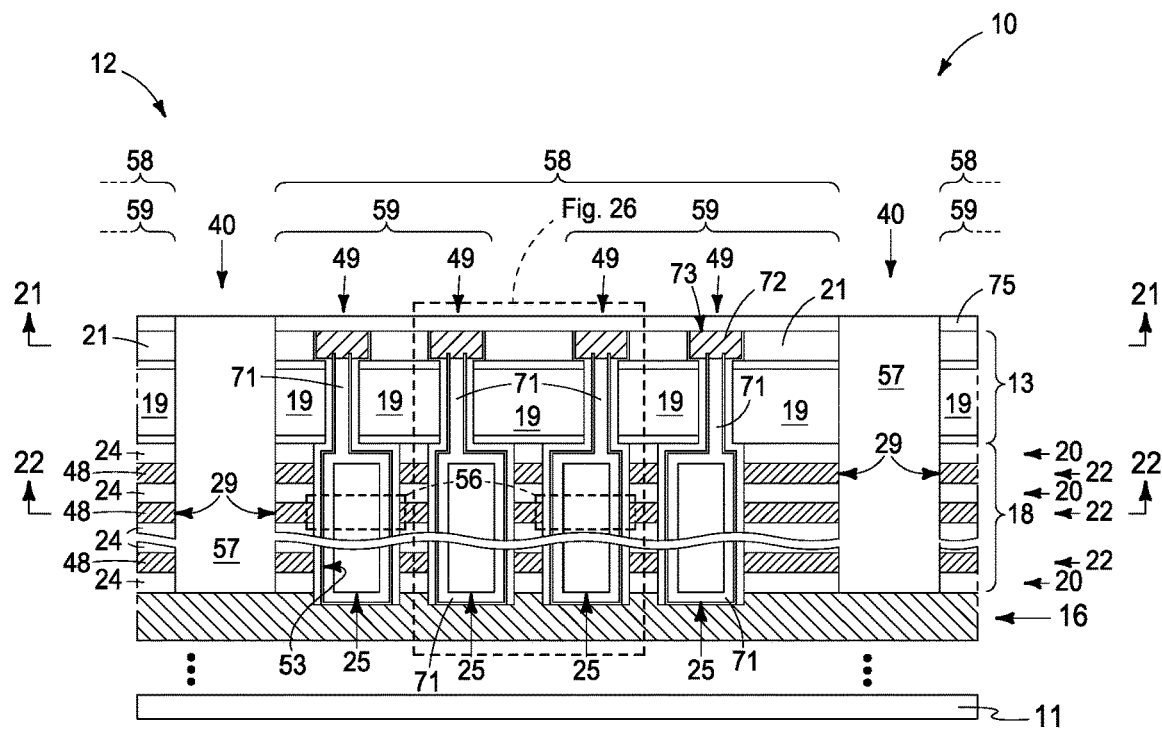
Figure 24:
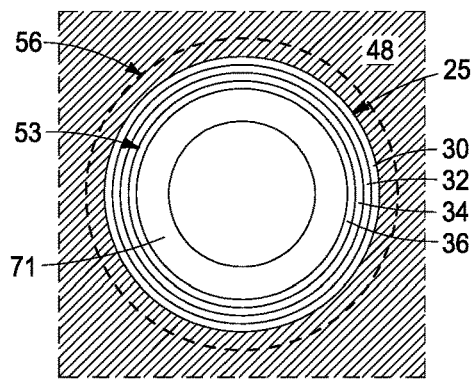
Figure 25:
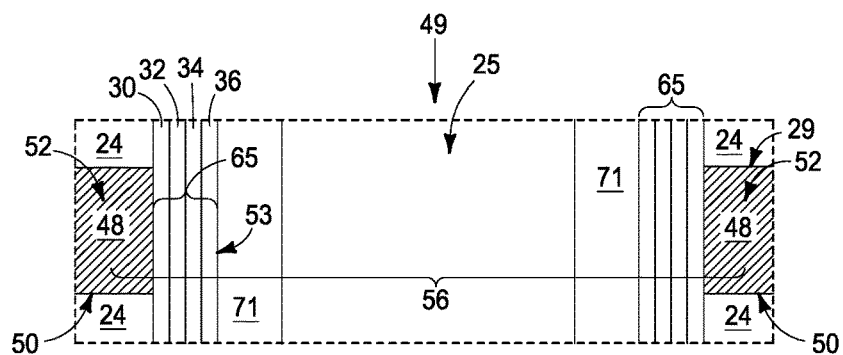
Figure 26:
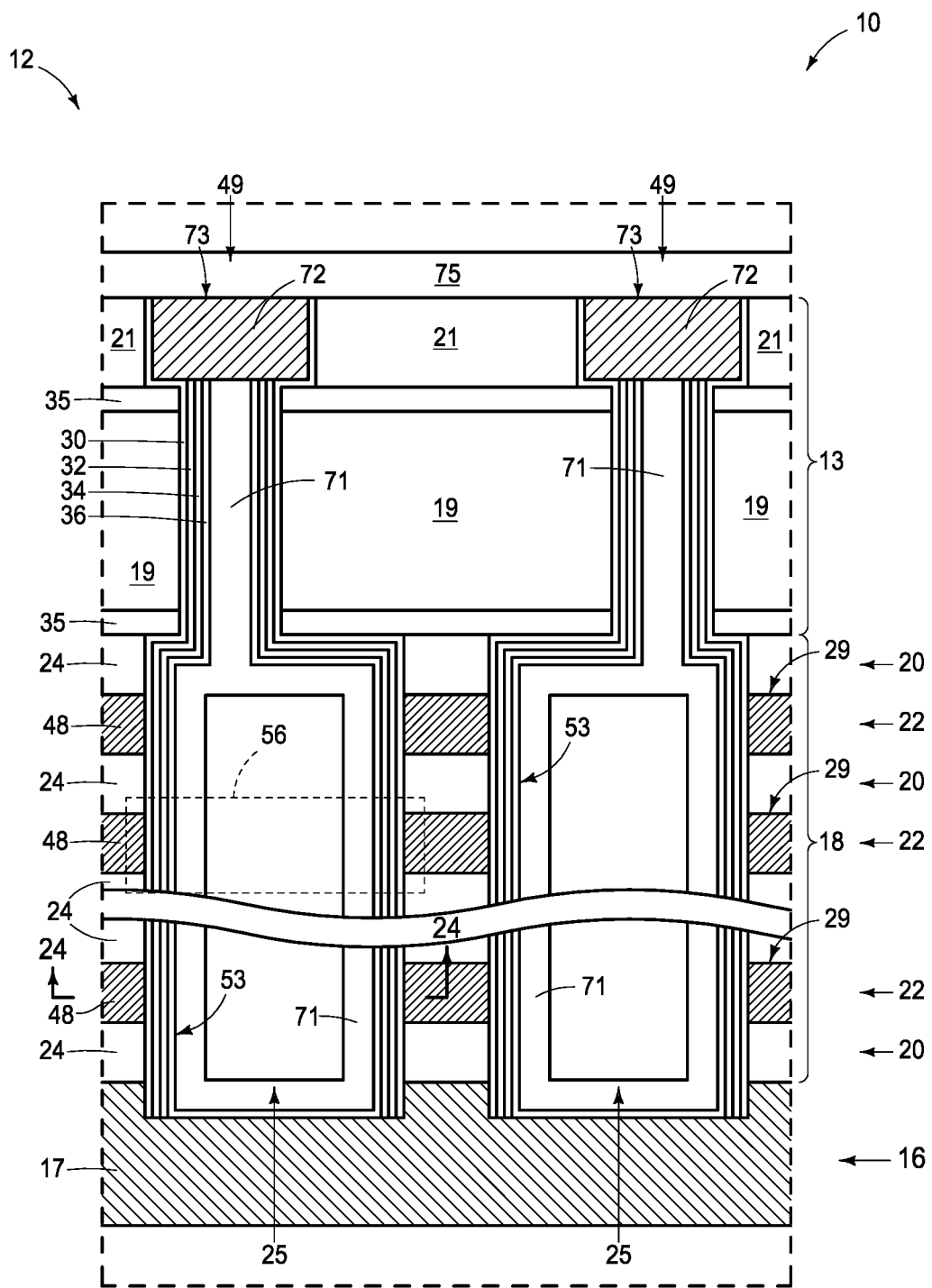

Referring to FIG. 20, some of channel material 36, some of charge-passage material 34, and some of storage material 32 have been respectively selectively etched. Remaining portions of exposed channel material 36 are ideally then conductively-doped. Thereafter, conductive metal material 72 (e.g., W over TiN over Ti) has been formed over upper channel openings 39 and that is directly electrically coupled to channel material 36 that is in select-gate region 13, thereby forming conductive contacts/vias 73 therefrom that individually directly electrically couple with channel material 36 that is in individual upper channel openings 39. Insulating material 75 (e.g., silicon dioxide) may then be formed to protect conductive contacts/vias 73 if desired.

Referring to FIGS. 21-26, horizontally-elongated trenches 40 have been formed (e.g., by anisotropic etching) between immediately-laterally-adjacent memory-block regions 58. Trenches 40 may be wider than lower channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally inward and/or outward in vertical cross-section (not shown). Thereafter and through trenches 40, material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Sidewalls of sacrifice material 19 may be oxidized (not shown) to protect such from the etching chemistry that is used to etch away material 26. Material 26 in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18.

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual lower channel openings 25 such that each lower channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming lower channel openings 25 and/or trenches 40. Alternately, the conducting material of the conductive tiers may be formed before forming lower channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has then been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

Figure 27:
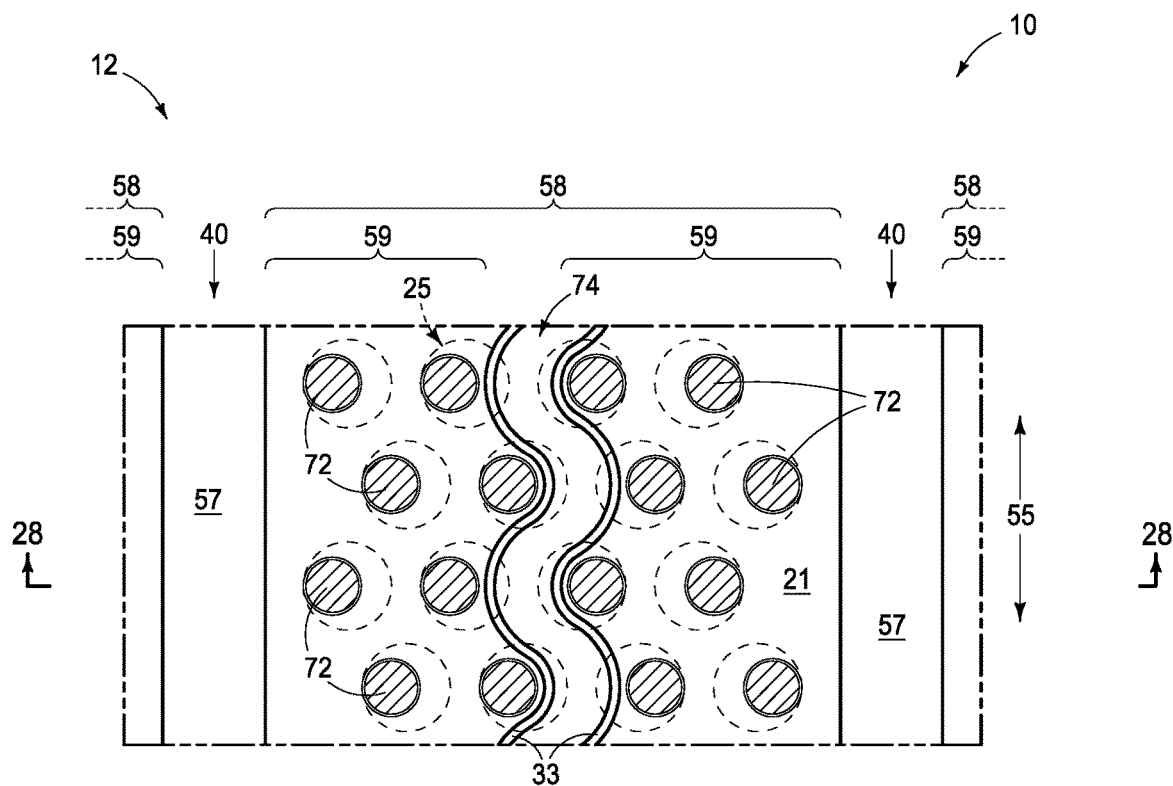
Figure 28:
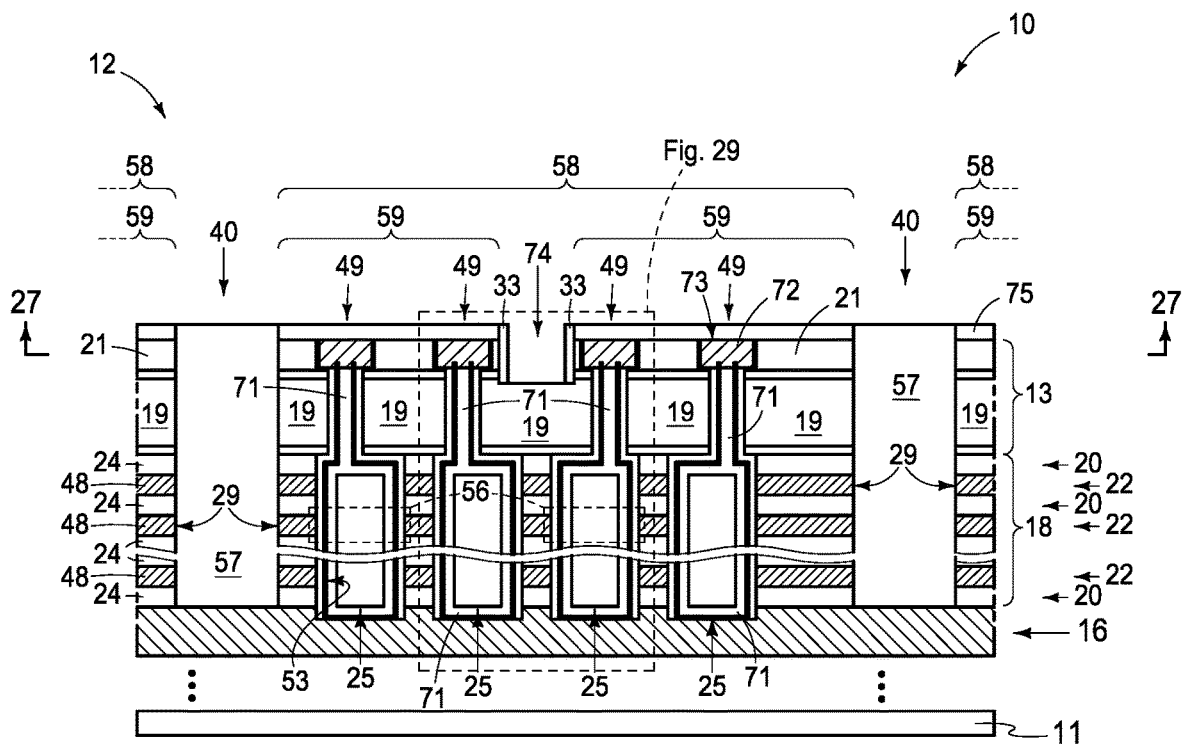
Figure 29:
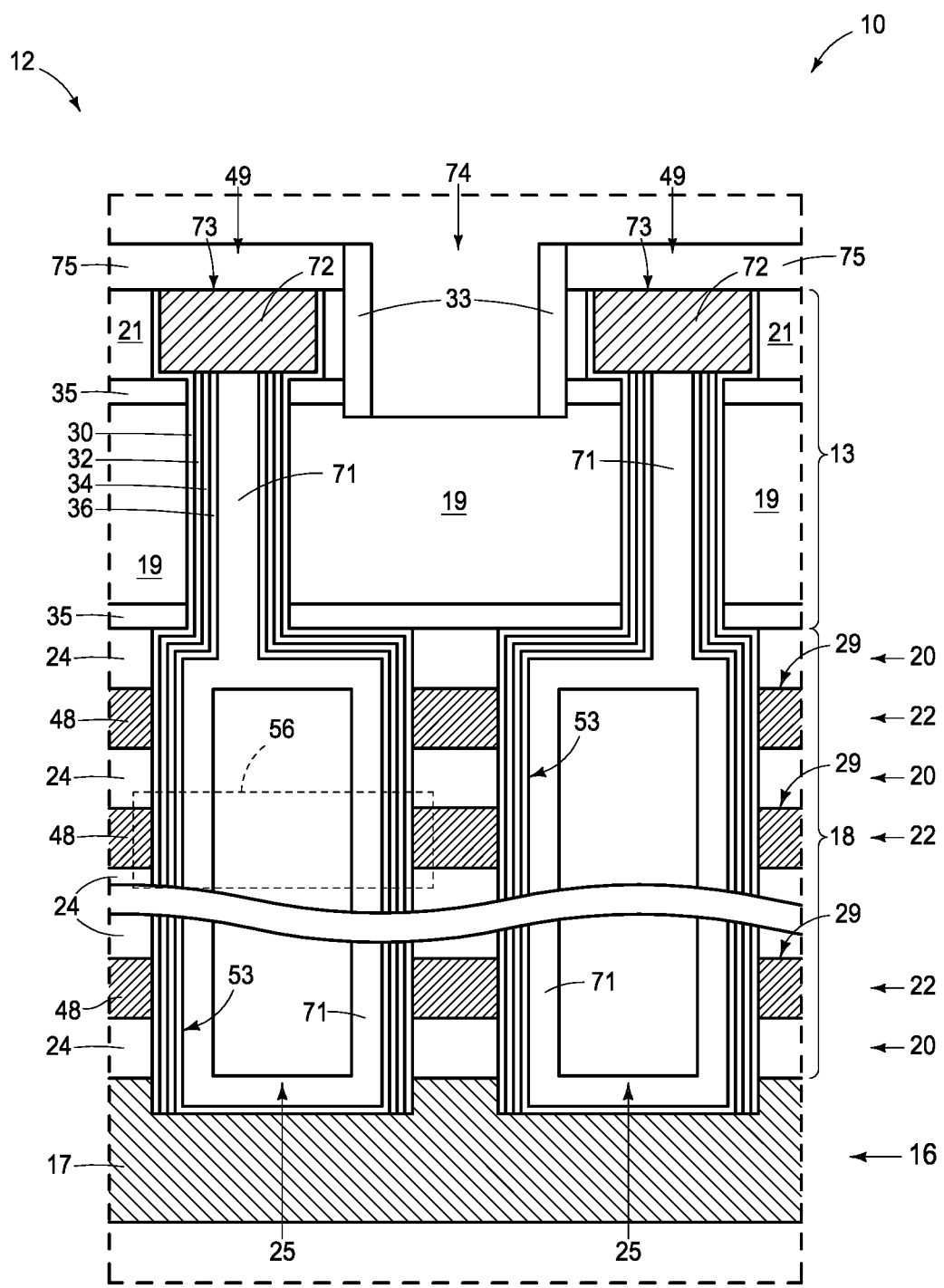

Referring to FIGS. 27-29, sub-block trenches 74 have been formed in select-gate region 13 through insulating material 21 (and insulating material 75 and/or upper layer 35 if present) to sacrifice material 19, with the sub-block trenches 74 being individually between immediately-laterally-adjacent sub-blocks 59. In one embodiment and as shown, sidewalls of the sub-block trenches 74 have been lined with first insulative material 33, for example by deposition of material 33 followed by anisotropic-spacer etching thereof. (e.g., silicon dioxide; e.g., as an etch-stop material and/or to provide isolation between trenches 74 and conductive metal material 72 if such is laterally-exposed when forming trenches 74).

Figure 30:
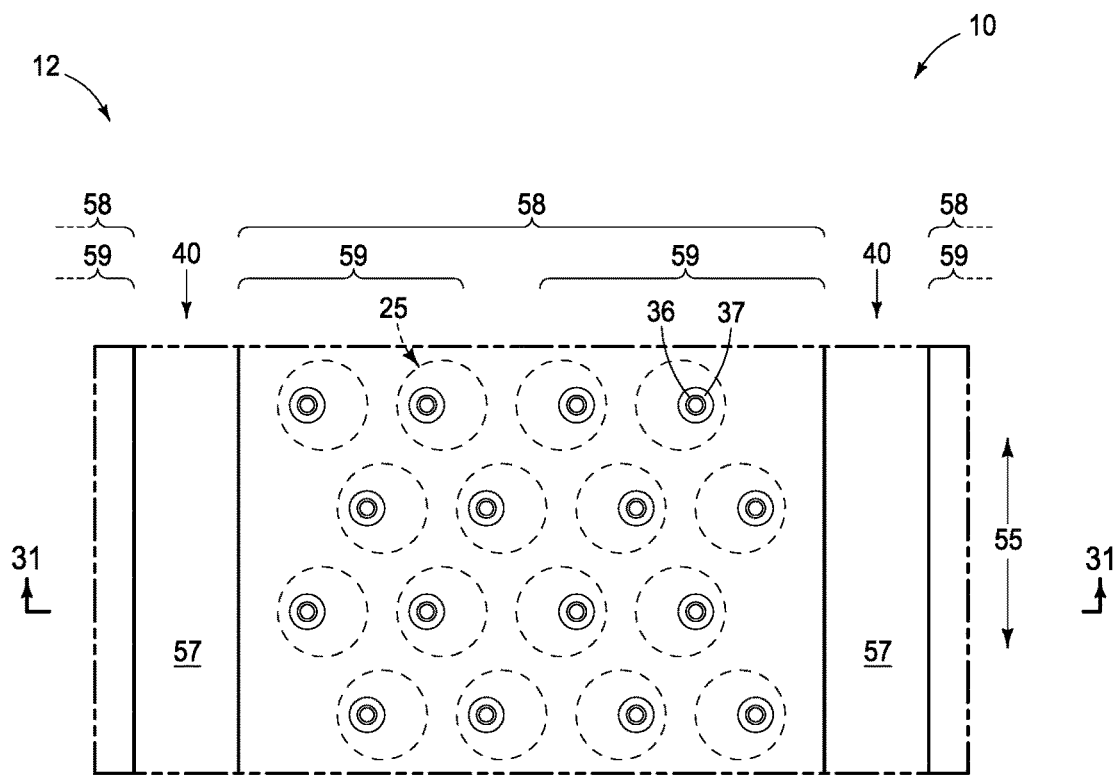
Figure 31:
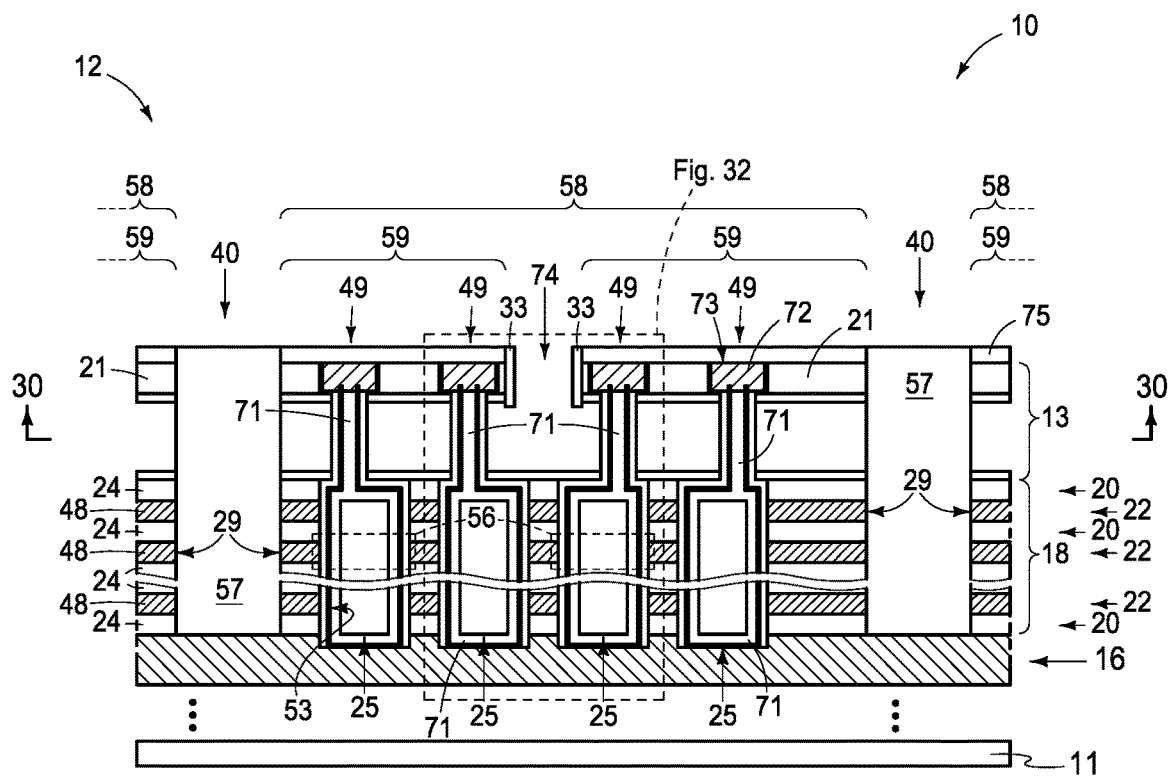
Figure 32:
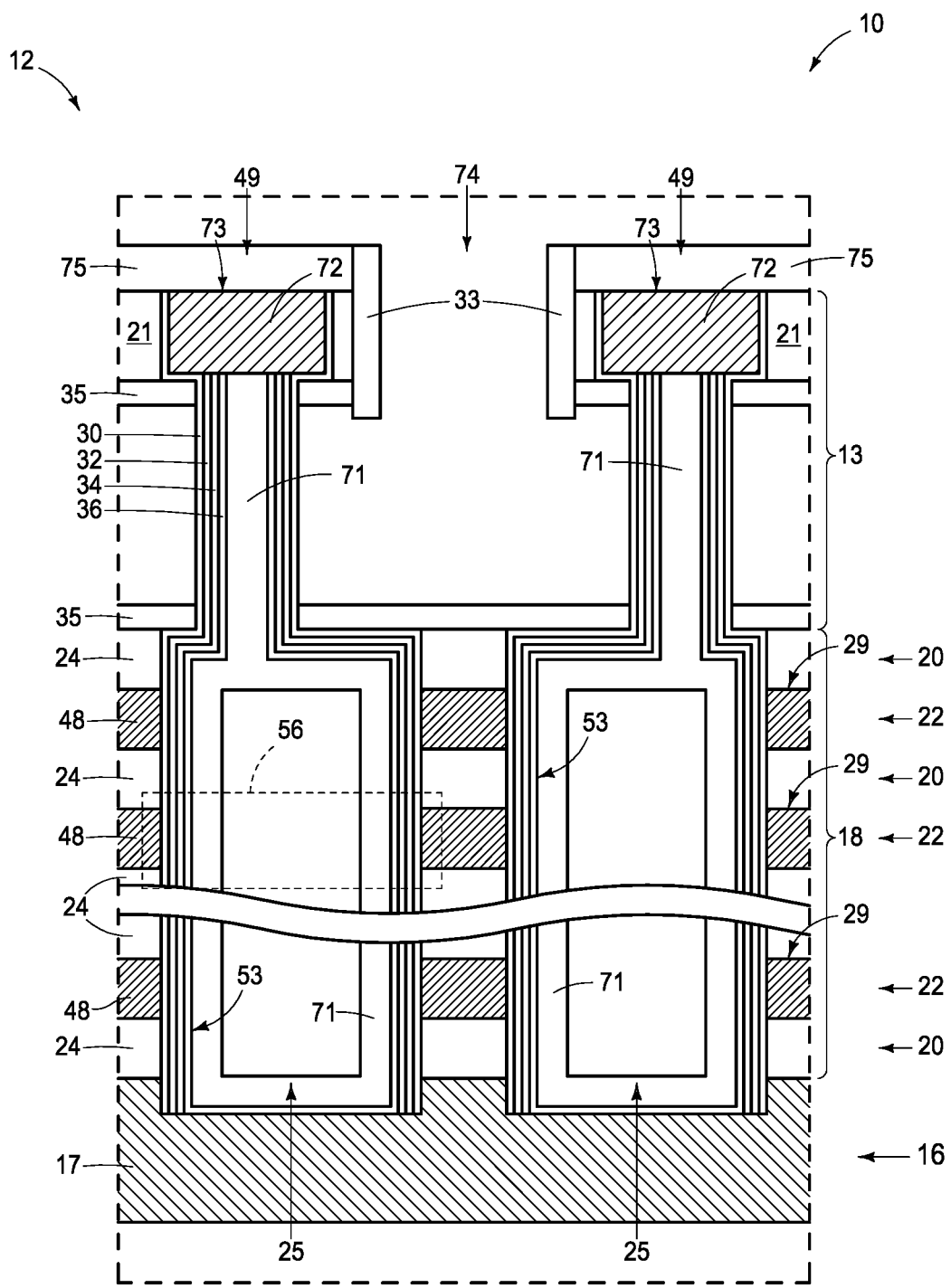

Referring to FIGS. 30-32, sacrifice material 19 (not shown) has been etched away through trenches 74.

Figure 33:
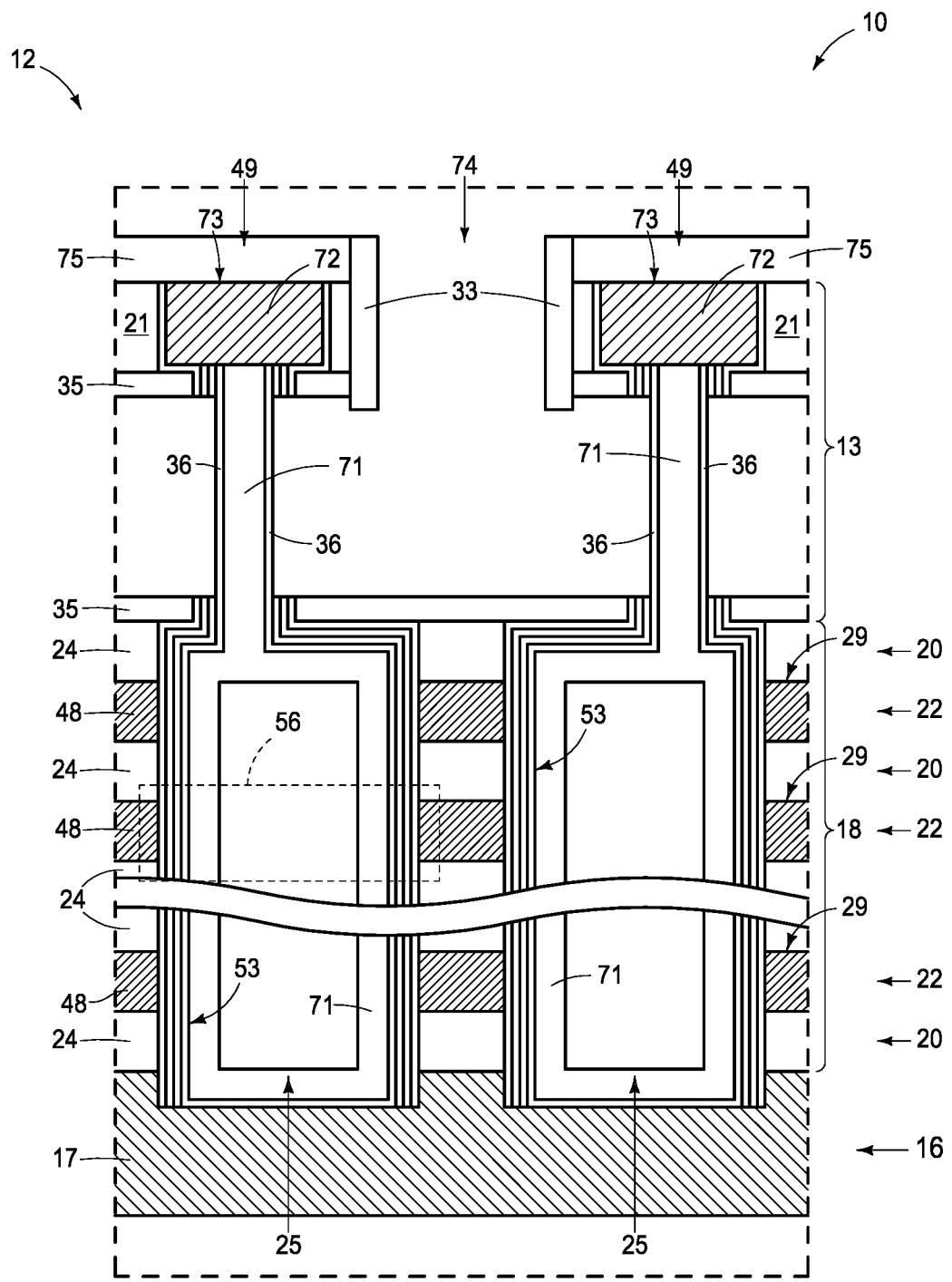

At least the storage material is removed from the upper channel openings through the sub-block trenches. FIG. 33 shows one embodiment where charge-blocking material 30 (if present), storage material 32, and charge-passage material 34 have been removed from upper channel openings 39 through sub-block trenches 74 (e.g., by isotropic etching).

Figure 34:
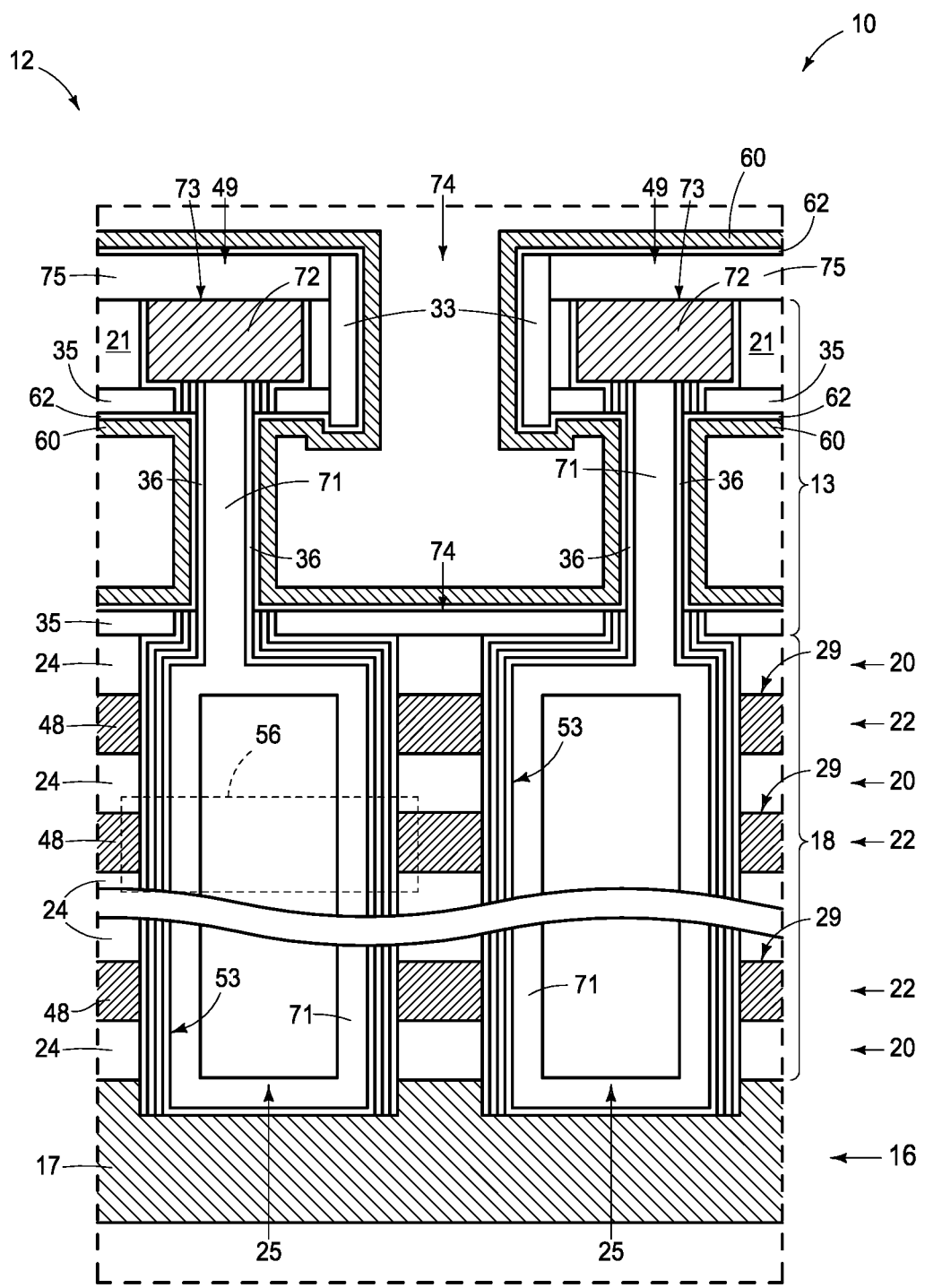

Referring to FIG. 34, and in one embodiment, sidewalls of individual sub-block trenches 74 have been lined with conductive material 60 (e.g., W over TiN) that less-than-fills sub-block trenches 74 and that spans across a bottom 61 of individual sub-block trenches 74 between immediately-laterally-adjacent sub-blocks 59. A gate insulator 62 has been formed prior. Alternately, and by way of example, charge-passage material 34 may not be removed in the processing shown by FIG. 33 and remain to function as a gate insulator in the absence of forming gate insulator 62 (or in addition thereto). Conductive material 60 is also formed laterally-over first-insulative-material lining 33 that is in sub-block trenches 74 (if present).

Figure 35:
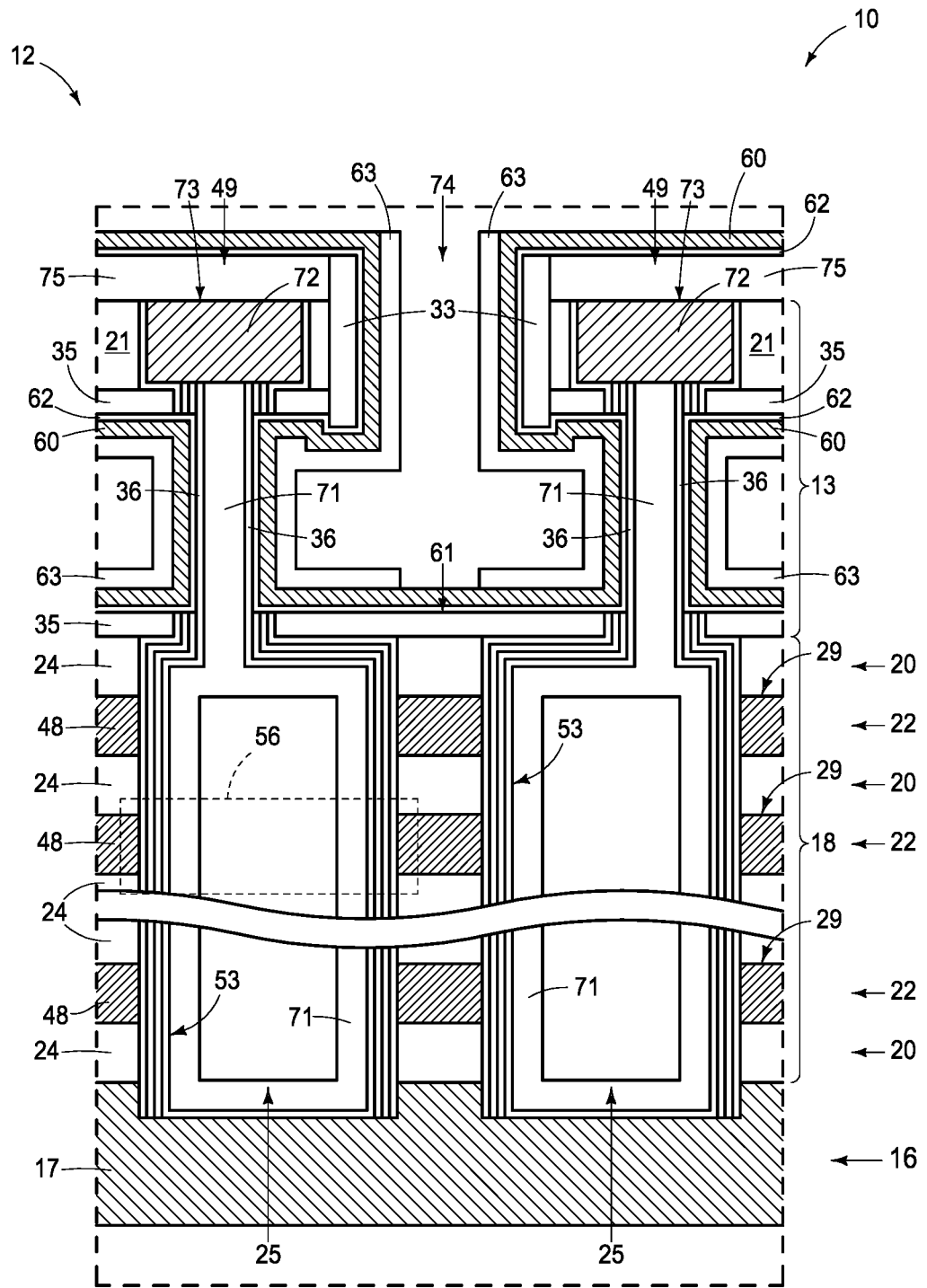

Referring to FIG. 35, and in one embodiment, a second-insulative-material lining 63 (e.g., silicon dioxide) has been formed within sub-block trenches 59 laterally-over conductive material 60 (e.g., and then maskless anisotropically etched to substantially remove such from being over horizontal surfaces in a spacer-like etch).

Figure 36:
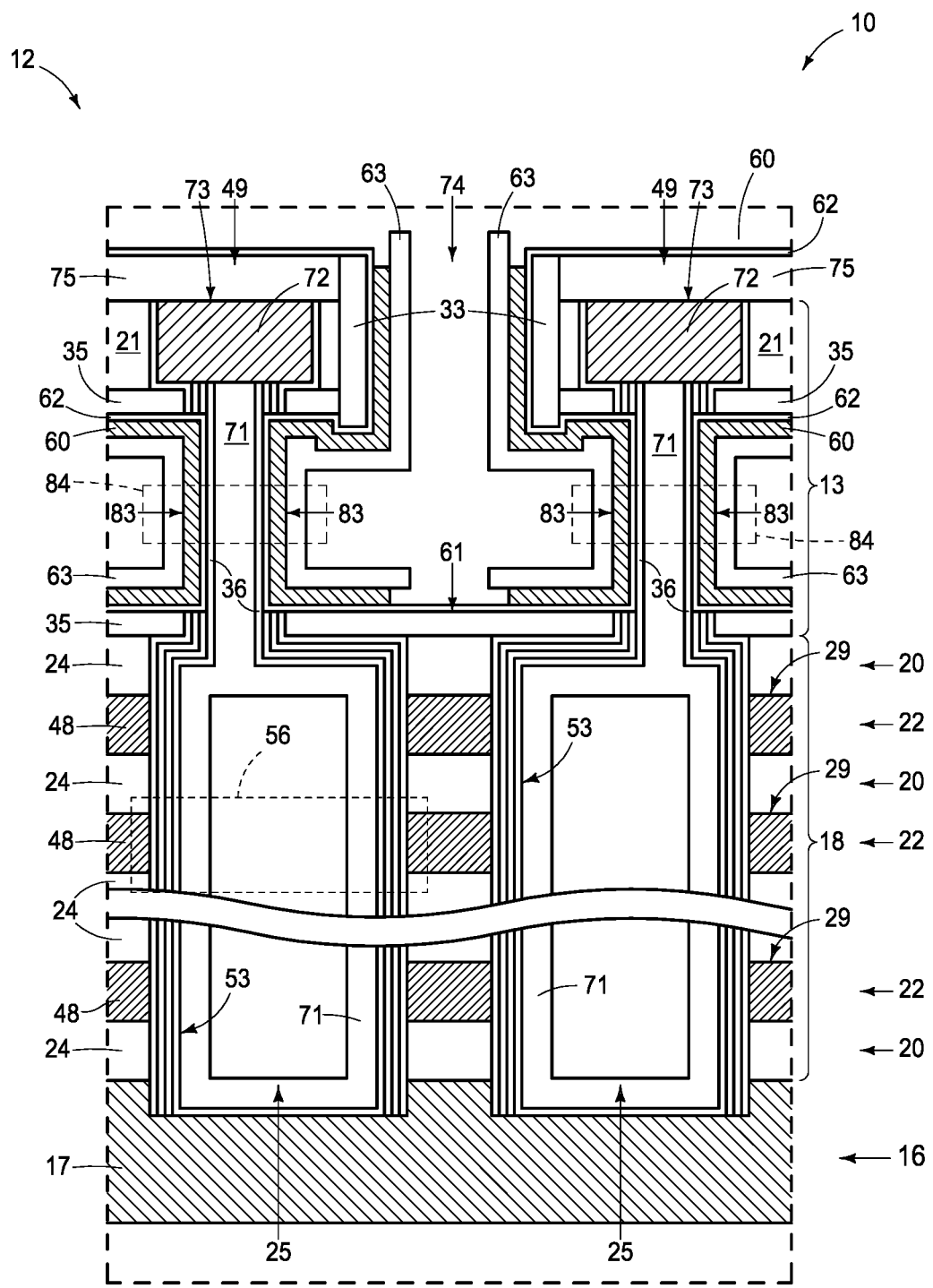

Referring to FIG. 36, etching has been conducted through conductive material 60 that spans across bottoms 61 of individual sub-block trenches 74 (isotropically or anisotropically) to form a select gate 83 in select-gate region 13 in individual sub-blocks 59 operatively aside channel material 36 that is in select-gate region 13 in individual sub-blocks 59. Select-gate transistors 84 are thereby formed.

Figure 37:
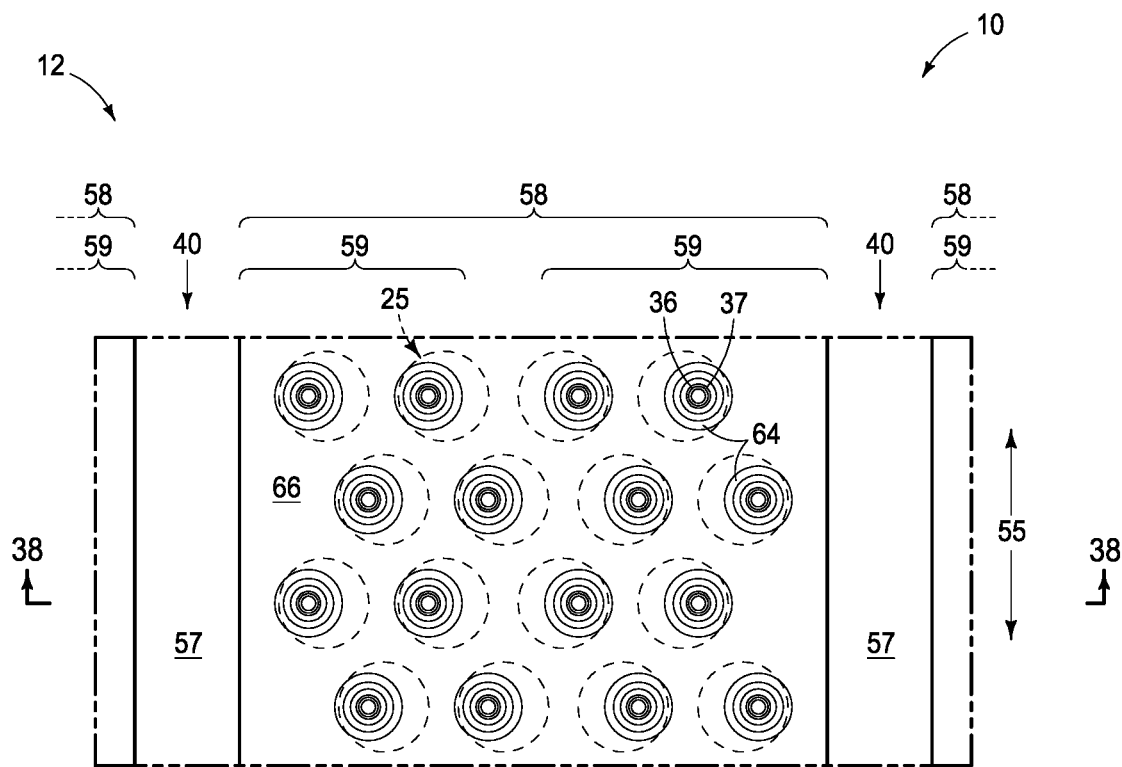
Figure 38:
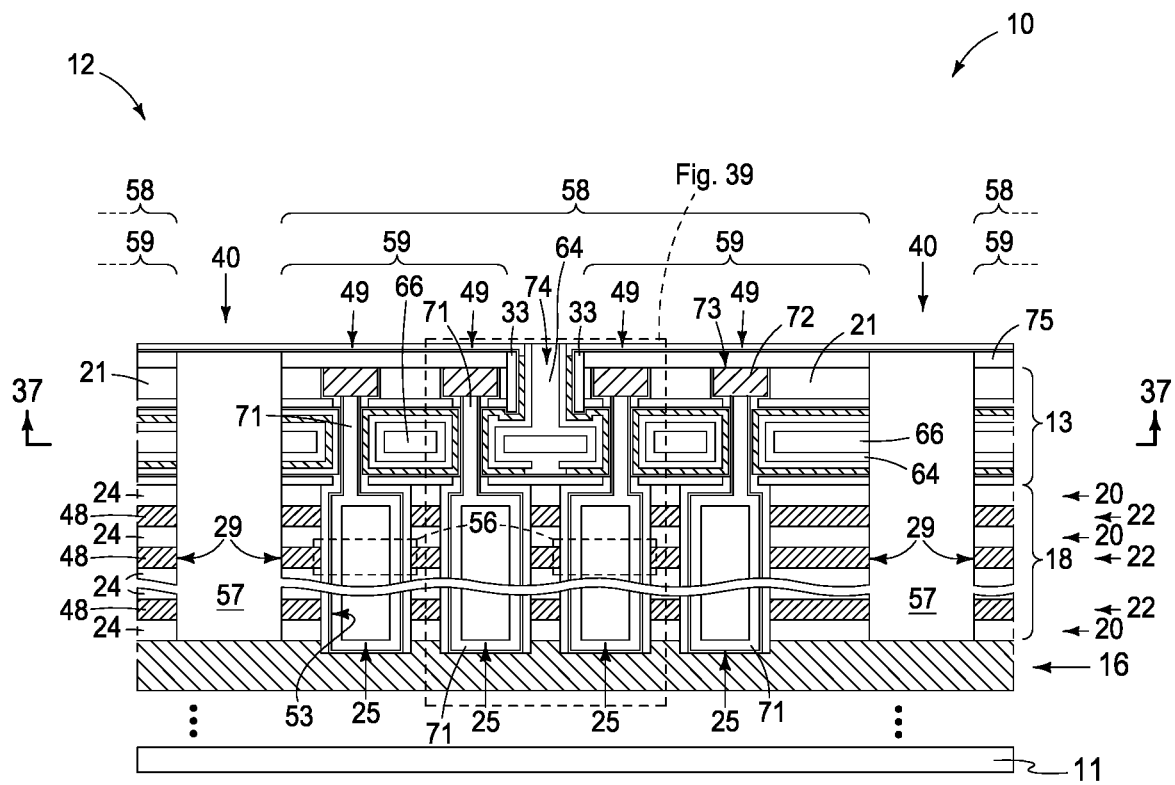
Figure 39:
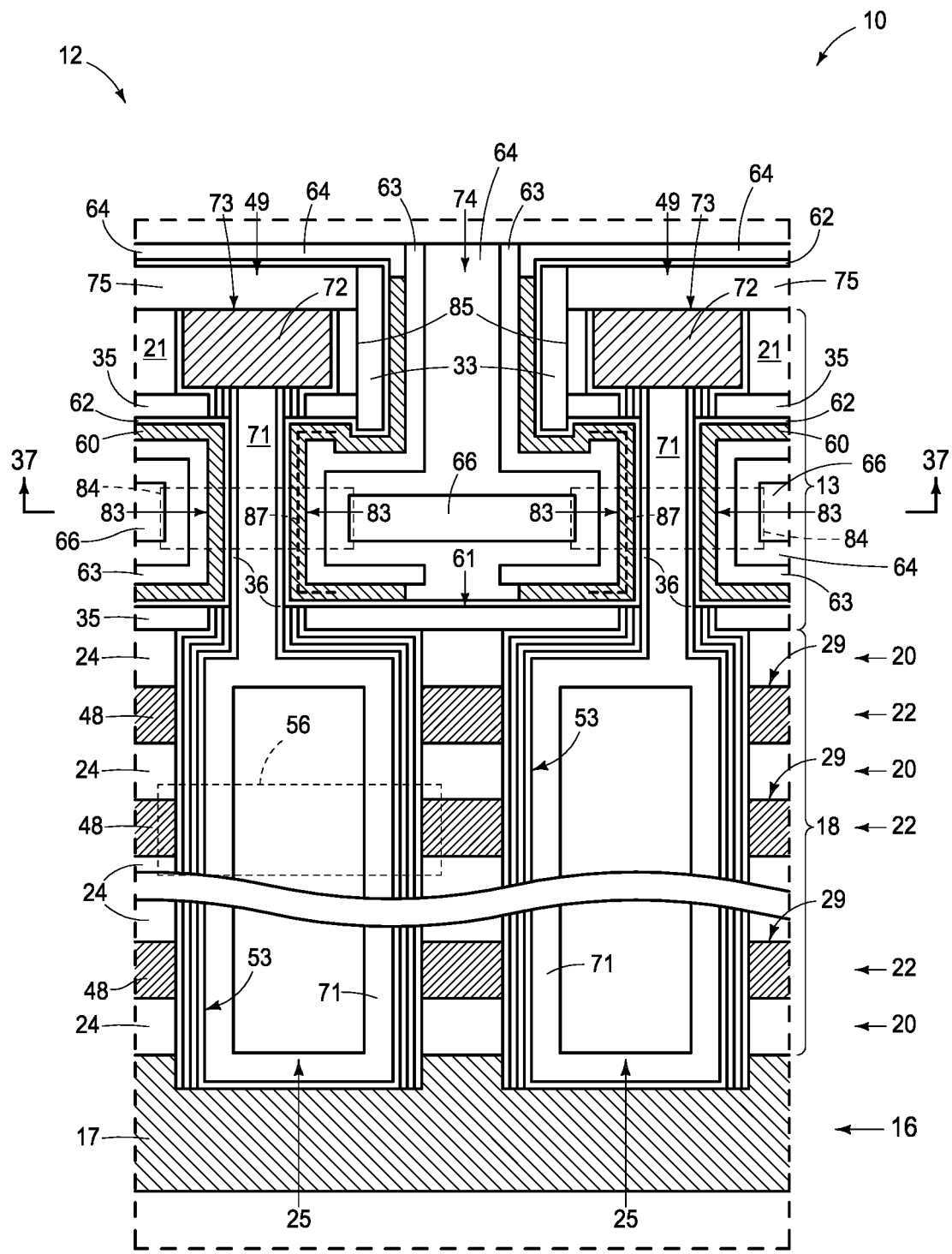

Referring to FIGS. 37-39, and in one embodiment, solid insulative material 64 (e.g., silicon dioxide) has been formed in sub-block trenches 74 and is directly above and directly below a void space 66 that is in sub-block trenches 74. Regardless, select gates 83 and conductive vias 73 would electrically connect with respective other circuitry components (not shown) not material to the invention and, for example, from adjacent tops of select gates 83 and conductive vias 73.

In one embodiment, conductive material 60 of select gates 83 extends laterally-into sub-block trenches 74 in a finished-circuitry construction. In one embodiment, select gates 83 on opposing sides 85 (FIG. 39) of individual sub-block trenches 74 comprise mirror-image C-shapes 87 in a vertical cross-section (e.g., that of FIG. 39).

Method embodiments of the invention may facilitate use of a single channel-material deposition for select-gate transistors and memory-cell transistors where the channel-openings for the select-gate transistors are smaller than those for the memory-cell transistors. Method embodiments of the invention may also facilitate more precise control of distance from the top of the select gates of a heaviest-concentration dopant region in the select-gate channel material that may be used to facilitate better direct electrical coupling of the top of the select-gate channel material with a via 73 that comprises conductive metal material.

Any other attribute(s) or aspect(s) as shown and/or described herein with respect to other embodiments may be used in the embodiments shown and described with reference to the above embodiments.

In one embodiment, a method used in forming memory circuitry (e.g., 10) comprises forming a stack (e.g., 18) where strings (e.g., 49) of memory cells (e.g., 56) will be formed and a select-gate region (e.g., 13) directly above the stack. The stack comprises vertically-alternating different-composition first tiers (e.g., 22) and second tiers (e.g., 20) having lower channel openings (e.g., 25) extending therethrough. The select-gate region comprises upper channel openings (e.g., 39) extending there-through and that are individually directly above and extend to individual of the lower channel openings. Storage material (e.g., 32) of the strings of memory cells is formed simultaneously in the upper and lower channel openings. Then, insulative charge-passage material (e.g., 34) of the strings of memory cells is formed simultaneously in the upper and lower channel openings. Then, channel material (e.g., 36) is formed simultaneously in the upper and lower channel openings. The storage material (at least) is removed from the upper channel openings. After the removing, a select gate (e.g., 83) is formed in the select-gate region operatively aside the channel material in the select-gate region. Any other attribute(s) or aspect(s) as shown and/or described herein with respect to other embodiments may be used.

In one embodiment, a method used in forming memory circuitry (e.g., 10) comprising strings (e.g., 49) of memory cells (e.g., 56) comprises forming a stack (e.g., 18) and a select-gate region (e.g., 13) directly above the stack. The stack comprises vertically-alternating different-composition first tiers (e.g., 22) and second tiers (e.g., 20). The stack comprises memory blocks (e.g., 58) comprising channel-material strings (e.g., 53) extending through the first tiers and the second tiers. The select-gate region comprises sub-blocks (e.g., 59). Sub-block trenches (e.g., 74) are formed in the select-gate region individually between immediately-laterally-adjacent of the sub-blocks. Sidewalls of individual of the sub-block trenches are lined with conductive material (e.g., 60) that less-than-fills the sub-block trenches and that spans across a bottom (e.g., 61) of the individual sub-block trenches between the immediately-laterally-adjacent sub-blocks. The conductive material that spans across the bottoms of the individual sub-block trenches is etched through to form a select gate (e.g., 83) in the select-gate region in individual of the sub-blocks operatively aside channel material (e.g., 36) that is in the select-gate region in the individual sub-blocks. Any other attribute (s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, memory circuitry (e.g., 10) comprises a stack (e.g., 18) comprising vertically-alternating insulative tiers (e.g., 20) and conductive tiers (e.g., 22). The stack comprises laterally-spaced memory blocks (e.g., 58). The memory blocks individually comprise sub-blocks (e.g., 59) in upper portions thereof and that individually comprise select gates (e.g., 83). Strings (e.g., 49) of memory cells (e.g., 56) comprising channel-material strings (e.g., 53) extend through the insulative tiers and the conductive tiers in the memory blocks. Sub-block trenches (e.g., 74) are in the upper portion of the memory blocks and are individually between immediately-laterally-adjacent of the sub-blocks. Conductive material (e.g., 60) of the select gates extends laterally-into the sub-block trenches. Any other attribute(s) or aspect(s) as shown and/or described herein with respect to other embodiments may be used.

In one embodiment, memory circuitry (e.g., 10) comprises a stack (e.g., 18) comprising vertically-alternating insulative tiers (e.g., 20) and conductive tiers (e.g., 22). The stack comprises laterally-spaced memory blocks (e.g., 58). The memory blocks individually comprise sub-blocks (e.g., 59) in upper portions thereof and that individually comprise select gates (e.g., 83). Strings (e.g., 49) of memory cells (e.g., 56) comprising channel-material strings (e.g., 53) extend through the insulative tiers and the conductive tiers in the memory blocks. Sub-block trenches (e.g., 74) are in the upper portion of the memory blocks and are individually between immediately-laterally-adjacent of the sub-blocks. The select gates on opposing sides (e.g., 85) of individual of the sub-block trenches comprise mirror-image C-shapes (e.g., 87) in a vertical cross-section (e.g., that of FIG. 39). Any other attribute(s) or aspect(s) as shown and/or described herein with respect to other embodiments may be used.

In one embodiment, memory circuitry (e.g., 10) comprises a stack (e.g., 18) comprising vertically-alternating insulative tiers (e.g., 20) and conductive tiers (e.g., 22). The stack comprises laterally-spaced memory blocks (e.g., 58). The memory blocks individually comprise sub-blocks (e.g., 59) in upper portions thereof and that individually comprise select gates (e.g., 83). Strings (e.g., 49) of memory cells (e.g., 56) comprising channel-material strings (e.g., 53) extend through the insulative tiers and the conductive tiers in the memory blocks. Sub-block trenches (e.g., 74) are in the upper portion of the memory blocks and are individually between immediately-laterally-adjacent of the sub-blocks. Solid insulative material (e.g., 64) in the sub-block trenches is directly above and directly below a void space (e.g., 66) that is in the sub-block trenches. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, and power modules, communication modems, processor modules, application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly"

only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming memory circuitry comprises forming a stack where strings of memory cells will be formed and a select-gate region directly above the stack. The stack comprises vertically-alternating different-composition first tiers and second tiers having lower channel openings extending there-through. The select-gate region comprises upper channel openings extending there-through and that are individually directly above and extend to individual of the lower channel openings. Storage material of the strings of memory cells is formed simultaneously in the upper and lower channel openings. Then, insulative charge-passage material of the strings of memory cells is formed simultaneously in the upper and lower channel openings. Then, channel material is formed simultaneously in the upper and lower channel openings. The storage material is removed from the upper channel openings. After the removing, a select gate is formed in the select-gate region operatively aside the channel material in the select-gate region.

In some embodiments, a method used in forming memory circuitry comprising strings of memory cells comprises forming a stack and a select-gate region directly above the stack. The stack comprises vertically-alternating different-composition first tiers and second tiers. The stack comprises memory blocks comprising channel-material strings extending through the first tiers and the second tiers. The select-gate region comprises sub-blocks. Sub-block trenches are formed in the select-gate region that are individually between immediately-laterally-adjacent of the sub-blocks. Sidewalls of individual of the sub-block trenches are lined with conductive material that less-than-fills the sub-block trenches and that spans across a bottom of the individual sub-block trenches between the immediately-laterally-adjacent sub-blocks. The conductive material that spans across the bottoms of the individual sub-block trenches is etched through to form a select gate in the select-gate region in individual of the sub-blocks operatively aside channel material that is in the select-gate region in the individual sub-blocks.

In some embodiments, a method used in forming memory circuitry comprises forming a stack where strings of memory cells will be formed. The stack comprises vertically-alternating different-composition first tiers and second tiers having lower channel openings extending there-through. The stack comprises memory blocks in which the lower channel openings are received. Sacrificial material is in upper portions of the lower channel openings. A select-gate region is formed directly above the stack. The select-gate region comprises sub-blocks comprising a sacrifice material and insulating material directly above the sacrifice material. The sacrifice material and the sacrificial material are of different compositions relative one another. Upper channel openings are formed through the insulating material and the sacrifice material and are individually directly above and extend to the sacrificial material that is in the upper portion of individual of the lower channel openings. The upper channel openings are horizontally larger in the insulating material than in the sacrifice material. Through the upper channel openings, the sacrificial material is etched away from the lower channel openings selectively relative to the insulating material, the sacrifice material, and the different-composition first tiers and second tiers. After etching the sacrificial material, storage material of the strings of memory cells is formed simultaneously in the upper and lower channel openings. Then, insulative charge-passage material of the strings of memory cells is formed simultaneously in the upper and lower channel openings. Then, channel material is formed simultaneously in the upper and lower channel openings. Insulator material is formed in the upper channel openings to fill those portions thereof that are within the sacrifice material and less-than-fill those portions thereof that are within the insulating material. At least some of the insulator material that is in individual of the upper channel openings in those portions thereof that are within the insulating material is etched to expose the channel material that is in the select-gate region. After the etching to expose the channel material that is in the select-gate region, conductive metal material is formed in the upper channel openings that is directly electrically coupled to the channel material that is in the select-gate region and form conductive contacts therefrom that individually directly electrically couple with the channel material that is in the individual upper channel openings. Sub-block trenches are formed in the select-gate region through the insulating material to the sacrifice material. The sub-block trenches are individually between immediately-laterally-adjacent of the sub-blocks. Through the sub-block trenches, the sacrifice material is etched away. Through the sub-block trenches, the storage material from the upper channel openings is removed. Sidewalls of individual of the sub-block trenches are lined with conductive material that less-than-fills the sub-block trenches and that spans across a bottom of the individual sub-block trenches between the immediately-laterally-adjacent sub-blocks. The conductive material that spans across the bottoms of the individual sub-block trenches is etched through to form a select gate in the select-gate region in individual of the sub-blocks operatively aside channel material that is in the select-gate region in the individual sub-blocks.

In some embodiments, memory circuitry comprises a stack comprising vertically-alternating insulative tiers and conductive tiers. The stack comprises laterally-spaced memory blocks. The memory blocks individually comprise sub-blocks in upper portions thereof and that individually comprise select gates. Strings of memory cells comprising channel-material strings extend through the insulative tiers and the conductive tiers in the memory blocks. Sub-block trenches are in the upper portion of the memory blocks and are individually between immediately-laterally-adjacent of the sub-blocks. Conductive material of the select gates extends laterally-into the sub-block trenches.

In some embodiments, memory circuitry comprises a stack comprising vertically-alternating insulative tiers and conductive tiers. The stack comprises laterally-spaced memory blocks. The memory blocks individually comprise sub-blocks in upper portions thereof and individually comprise select gates. Strings of memory cells comprising channel-material strings extend through the insulative tiers and the conductive tiers in the memory blocks. Sub-block trenches are in the upper portion of the memory blocks individually between immediately-laterally-adjacent of the sub-blocks. The select gates on opposing sides of individual of the sub-block trenches comprise mirror-image C-shapes in a vertical cross-section.

In some embodiments, memory circuitry comprises a stack comprising vertically-alternating insulative tiers and conductive tiers. The stack comprises laterally-spaced memory blocks. The memory blocks individually comprise sub-blocks in upper portions thereof and individually comprise select gates. Strings of memory cells comprising channel-material string extend through the insulative tiers and the conductive tiers in the memory blocks. Sub-block trenches are in the upper portion of the memory blocks individually between immediately-laterally-adjacent of the sub-blocks. Solid insulative material is in the sub-block trenches directly above and directly below a void space that is in the sub-block trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming memory circuitry, comprising:
    forming a stack where strings of memory cells are to be formed and a select-gate region directly above the stack, the stack comprising vertically-alternating different-composition first tiers and second tiers having lower channel openings extending there-through, the select-gate region comprising upper channel openings extending there-through and that are individually directly above and extend to individual of the lower channel openings;
    forming storage material of the strings of memory cells simultaneously in the upper and lower channel openings, then forming insulative charge-passage material of the strings of memory cells simultaneously in the upper and lower channel openings, and then forming channel material simultaneously in the upper and lower channel openings;
    removing the storage material from the upper channel openings; and
    after the removing, forming a select gate in the select-gate region operatively aside the channel material in the select-gate region.

2. The method of claim 1 comprising:
   forming charge-blocking material of the strings of memory cells simultaneously in the upper and lower channel openings forming the storage material and then forming the storage material of the strings of memory cells simultaneously in the upper and lower channel openings; and
   removing the charge-blocking material from the upper channel openings prior to forming the select gate in the select-gate region.

3. The method of claim 1 wherein the select-gate region comprises sub-blocks and further comprising:
   forming sub-block trenches in the select-gate region that are individually between immediately-laterally-adjacent of the sub-blocks;
   lining sidewalls of individual of the sub-block trenches with conductive material that less-than-fills the sub-block trenches and that spans across a bottom of the individual sub-block trenches between the immediately-laterally-adjacent sub-blocks; and
   etching through the conductive material that spans across the bottoms of the individual sub-block trenches to form the select gate in the select-gate region in individual of the sub-blocks operatively aside channel material that is in the select-gate region in the individual sub-blocks.

4. The method of claim 3 wherein conductive material of the select gates extends laterally-into the sub-block trenches in a finished-circuitry construction.

5. The method of claim 3 wherein the select gates on opposing sides of individual of the sub-block trenches comprise mirror-image C-shapes in a vertical cross-section.

6. The method of claim 5 wherein conductive material of the select gates extends laterally-into the sub-block trenches in a finished-circuitry construction.

7. The method of claim 1 comprising:
   forming sub-block trenches in the select-gate region that are individually between immediately-laterally-adjacent of the sub-blocks; and
   forming solid insulative material in the sub-block trenches that is directly above and directly below a void space that is in the sub-block trenches.

8. A method used in forming memory circuitry, comprising:
   forming a stack where strings of memory cells are to be formed, the stack comprising vertically-alternating different-composition first tiers and second tiers having lower channel openings extending there-through, the stack comprising memory blocks in which the lower channel openings are received, sacrificial material being in upper portions of the lower channel openings;
   forming a select-gate region directly above the stack, the select-gate region comprising sub-blocks comprising a sacrifice material and insulating material directly above the sacrifice material, the sacrifice material and the sacrificial material being of different compositions relative one another;
   forming upper channel openings through the insulating material and the sacrifice material and that are individually directly above and extend to the sacrificial material that is in the upper portion of individual of the lower channel openings, the upper channel openings being horizontally larger in the insulating material than in the sacrifice material;
   through the upper channel openings, etching away the sacrificial material from the lower channel openings selectively relative to the insulating material, the sacrifice material, and the different-composition first tiers and second tiers;
   after etching the sacrificial material, forming storage material of the strings of memory cells simultaneously in the upper and lower channel openings, then forming insulative charge-passage material of the strings of memory cells simultaneously in the upper and lower channel openings, and then forming channel material simultaneously in the upper and lower channel openings;
   forming insulator material in the upper channel openings to fill those portions thereof that are within the sacrifice material and less-than-fill those portions thereof that are within the insulating material;
   etching at least some of the insulator material that is in individual of the upper channel openings in those portions thereof that are within the insulating material to expose the channel material that is in the select-gate region;
   after the etching to expose the channel material that is in the select-gate region, forming conductive metal material in the upper channel openings that is directly electrically coupled to the channel material that is in the select-gate region and forming conductive contacts therefrom that individually directly electrically couple with the channel material that is in the individual upper channel openings;
   forming sub-block trenches in the select-gate region through the insulating material to the sacrifice material, the sub-block trenches being individually between immediately-laterally-adjacent of the sub-blocks;
   through the sub-block trenches, etching away the sacrifice material;
   through the sub-block trenches, removing the storage material from the upper channel openings;
   lining sidewalls of individual of the sub-block trenches with conductive material that less-than-fills the sub-block trenches and that spans across a bottom of the individual sub-block trenches between the immediately-laterally-adjacent sub-blocks; and
   etching through the conductive material that spans across the bottoms of the individual sub-block trenches to form a select gate in the select-gate region in individual of the sub-blocks operatively aside channel material that is in the select-gate region in the individual sub-blocks.

9. The method of claim 8 wherein the sacrifice material is vertically sandwiched between two layers of carbon-doped silicon nitride.

10. The method of claim 9 wherein carbon content in the carbon-doped silicon nitride is $1 \times 10^{15}$ atoms/cm$^3$ to 25 atomic percent.

11. The method of claim 8 comprising:
    forming charge-blocking material of the strings of memory cells simultaneously in the upper and lower channel openings forming the storage material and then forming the storage material of the strings of memory cells simultaneously in the upper and lower channel openings; and
    removing the charge-blocking material from the upper channel openings prior to forming the select gate in the select-gate region.

12. The method of claim 8 lining the sidewalls of the sub-block trenches with first insulative material prior to etching away the sacrifice material, the conductive material being formed laterally-over the first-insulative-material lining within the sub-block trenches.

13. The method of claim 12 comprising forming a second-insulative-material lining within the sub-block trenches laterally-over the conductive material prior to the etching through the conductive material that spans across the bottoms of the individual sub-block trenches.

14. The method of claim 8 wherein conductive material of the select gates extends laterally-into the sub-block trenches in a finished-circuitry construction.

* * * * *